United States Patent
Nakata et al.

(10) Patent No.: US 10,265,724 B2
(45) Date of Patent: Apr. 23, 2019

(54) IMPRINT MOLD AND IMPRINT METHOD

(71) Applicant: DAI NIPPON PRINTING CO., LTD., Tokyo (JP)

(72) Inventors: Naoko Nakata, Tokyo (JP); Kouji Yoshida, Tokyo (JP); Naoshi Kawamata, Tokyo (JP); Takaharu Nagai, Tokyo (JP); Koji Ichimura, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 7 days.

(21) Appl. No.: 15/128,323

(22) PCT Filed: Oct. 22, 2014

(86) PCT No.: PCT/JP2014/078039
§ 371 (c)(1),
(2) Date: Sep. 22, 2016

(87) PCT Pub. No.: WO2015/151323
PCT Pub. Date: Oct. 8, 2015

(65) Prior Publication Data
US 2017/0106408 A1 Apr. 20, 2017

(30) Foreign Application Priority Data

Apr. 1, 2014 (JP) .................................. 2014-075496
Apr. 1, 2014 (JP) .................................. 2014-075497

(51) Int. Cl.
*B29C 43/58* (2006.01)
*B05D 3/12* (2006.01)
(Continued)

(52) U.S. Cl.
CPC ............... *B05D 3/12* (2013.01); *B05D 3/067* (2013.01); *B29C 59/02* (2013.01); *G03F 7/0002* (2013.01); *H01L 21/027* (2013.01)

(58) Field of Classification Search
CPC ......... B29C 59/00; B29C 59/16; B29C 43/58; B29C 64/00; B29C 64/393
(Continued)

(56) References Cited

U.S. PATENT DOCUMENTS 7,794,222 B2 * 9/2010 Suehira .................. B82Y 10/00
425/385
2003/0021465 A1 1/2003 Adel et al.
(Continued)

FOREIGN PATENT DOCUMENTS

JP H09-22864 A 1/1997
JP 2007-305647 A 11/2007
(Continued)

OTHER PUBLICATIONS

Nov. 18, 2014 International Search Report issued in International Patent Application No. PCT/JP2014/078039.
(Continued)

*Primary Examiner* — Joseph S Del Sole
*Assistant Examiner* — Thu Khanh T Nguyen
(74) *Attorney, Agent, or Firm* — Oliff PLC

(57) ABSTRACT

An imprint mold has a base, an uneven structure area set on a surface of the base, a measurement area set in the uneven structure area, and a measurement mark structure positioned in the measurement area, the measurement mark structure having a plurality of pattern sets each having a line/space shape. With this, a deformation occurring in a resin layer at the time of release of the resin layer from the mold is prevented, and a measurement mark can be formed with high accuracy.

19 Claims, 28 Drawing Sheets

(51) Int. Cl.
*G03F 7/00* (2006.01)
*B05D 3/06* (2006.01)
*B29C 59/02* (2006.01)
*H01L 21/027* (2006.01)

(58) Field of Classification Search
USPC .................................................. 425/385
See application file for complete search history.

(56) References Cited

U.S. PATENT DOCUMENTS

| | | | |
|---|---|---|---|
| 2004/0021254 A1 | 2/2004 | Sreenivasan et al. | |
| 2007/0228610 A1* | 10/2007 | Sreenivasan | B29C 43/003 264/319 |
| 2011/0206852 A1 | 8/2011 | Shiode | |
| 2013/0134616 A1* | 5/2013 | Sato | B29C 59/022 425/149 |
| 2014/0061969 A1* | 3/2014 | Okamoto | B29C 59/002 425/385 |

FOREIGN PATENT DOCUMENTS

| | | | |
|---|---|---|---|
| JP | 2010-278041 A | 12/2010 | |
| JP | 2011-061025 A | 3/2011 | |
| JP | 2011-101016 A | 5/2011 | |
| JP | 2011176132 A | 9/2011 | |
| JP | 2012-080131 A | 4/2012 | |
| JP | 2014-049658 A | 3/2014 | |
| JP | 2014049658 A * | 3/2014 | ........... B29C 59/002 |

OTHER PUBLICATIONS

Dec. 5, 2017 Office Action issued in Japanese Patent Application No. 2014-075496.

Dec. 5, 2017 Office Action issued in Japanese Patent Application No. 2014-075497.

Mar. 13, 2018 Office Action issued in Japanese Patent Application No. 2014-075497.

* cited by examiner

IMPRINT MOLD AND IMPRINT METHOD

TECHNICAL FIELD

The present invention relates to an imprint mold having an uneven structure and an imprint method that uses the mold.

BACKGROUND ART

In recent years, as a fine pattern formation technique that replaces photolithography, a pattern formation technique that uses an imprint method attracts attention. The imprint method is the pattern formation technique in which one-to-one transfer of a fine structure is performed by using a mold member (mold) having a fine uneven structure and transferring the uneven structure to a molded resin. For example, in the imprint method in which a photo-curable resin is used as the molded resin, droplets of the photo-curable resin are supplied to the surface of a transfer substrate, a mold having a desired uneven structure and the transfer substrate are brought close to each other until the distance therebetween becomes a predetermined distance and the uneven structure is thereby filled with the photo-curable resin, light is emitted from the side of the mold in this state and the photo-curable resin is thereby cured, and, thereafter, a pattern structure having an uneven structure (uneven pattern) in which projections and depressions of the mold are inverted is formed by separating the mold from a resin layer. In addition, the transfer substrate is etched by using the pattern structure as an etching resist.

The mold used in the imprint method is manufactured usually by applying an electron beam-sensitive resist to a base for the mold, performing electron beam drawing on the resist to form a resist pattern, and etching the base by using the resist pattern as an etching mask to form an uneven pattern. Unfortunately, electron beam lithography that uses the electron beam drawing requires use of an expensive drawing apparatus and takes a long time to complete the drawing, and hence there has been a problem in that the manufacturing cost of the mold is increased. In addition, when a foreign object enters between the mold and the transfer substrate in the imprint, both of the mold and the transfer substrate are significantly damaged, and it becomes difficult to reuse the damaged mold, and hence there has been a problem in that the expensive mold manufactured by the electron beam lithography is lost.

To cope with this, a mold manufactured by the electron beam lithography is used as a master mold, a duplicate mold (hereinafter referred to as a replica mold) is manufactured from the master mold by the imprint method, and the pattern structure is fabricated on the transfer substrate such as a wafer substrate by the imprint method by using the replica mold.

The electron beam drawing is performed based on design coordinates that are designed in advance in the manufacturing of the master mold by the electron beam lithography described above, and the pattern coordinates in the replica mold manufactured by using the master mold are deviated from the original design coordinates due to an error factor occurring at the time of the imprint. In addition, the pattern coordinates in the pattern structure formed on the transfer substrate such as the wafer substrate by using the replica mold are also deviated from the original design coordinates due to the error factor occurring at the time of the imprint.

In the fabrication of the high-accuracy replica mold by using the master mold and the manufacturing of the high-accuracy pattern structure by using the replica mold, the state of the above deviation is grasped and the deviation is reflected in the original design coordinates, or correction is performed by generating a desired deformation in the mold at the time of the imprint. In addition, as means for grasping the state of the deviation described above, a plurality of measurement marks are provided in the master mold in advance, and the magnitude and the direction of the deviation are detected by measuring the measurement mark formed in the replica mold fabricated by using the master mold (an uneven structure in which projections and depressions of the measurement mark of the master mold are inverted) and measuring the measurement mark formed in the pattern structure fabricated by using the replica mold (an uneven structure in which projections and depressions of the measurement mark of the replica mold are inverted) (PTL 1 and 2).

CITATION LIST

Patent Literature

[PTL 1] Japanese Patent Application Laid-open No. 2010-278041
[PTL 2] Japanese Patent Application Laid-open No. 2011-61025

SUMMARY OF INVENTION

Technical Problem

Unfortunately, there has been a problem in that the measurement mark itself formed in the replica mold is deformed to be thicker, thinner, or bent due to the error factor occurring at the time of the imprint for the fabrication of the replica mold by using the master mold and, similarly, the measurement mark itself formed in the pattern structure is deformed due to the error factor occurring at the time of the imprint for the fabrication of the pattern structure by using the replica mold so that it is difficult to accurately detect the magnitude and the direction of the deviation. An example of the error factor described above includes a deformation occurring in a resin layer at the time of release of the resin layer from the mold of the imprint, and the deformation tends to become conspicuous particularly in the portion of the resin layer in which the mold release is started and in the portion of the resin layer in which the mold release is completed. In addition, in the case where the mold release is performed in a state in which the mold and/or the transfer substrate is deformed for the purpose of improving a separation property, for example, in the case where the mold release is performed in a state in which the transfer substrate is deformed so as to be slightly projected toward the mold, when the state of the transfer substrate becomes normal after the mold release, a deformation or a displacement occurs in the resin layer, and this is also one of the error factors.

The present invention has been made in view of the above circumstances, and an object thereof is to provide an imprint mold capable of preventing the deformation occurring in the resin layer at the time of the release of the resin layer from the mold, and forming the measurement mark with high accuracy, and an imprint method that uses such a mold.

Solution to Problem

In order to achieve the above object, an imprint mold of the present invention includes a base, an uneven structure area set on a surface of the base, a measurement area set in the uneven structure area, and a measurement mark structure positioned in the measurement area, the measurement mark structure has a plurality of pattern sets, and each of the pattern sets has a line/space shape.

As another aspect of the present invention, at least one of a line width and a space width of the pattern set is less than a resolution of a position detection apparatus used when a measurement mark formed by the measurement mark structure is detected.

An imprint mold of the present invention includes a base, an uneven structure area set on a surface of the base, a measurement area set in the uneven structure area, and a measurement mark structure positioned in the measurement area, the measurement mark structure has a plurality of pattern sets, and each of the pattern sets is a set of patterns each having a plan view shape having rotational symmetry having a four-fold axis at a constant angle of 90°.

As another aspect of the present invention, an interval between the adjacent patterns constituting the pattern set is less than a resolution of a position detection apparatus used when a measurement mark formed by the measurement mark structure is detected.

As another aspect of the present invention, a plan view shape of an outline of the pattern set is a rectangular shape, and a dimension of the rectangular shape is not less than a resolution of a position detection apparatus used when a measurement mark formed by the measurement mark structure is detected.

As another aspect of the present invention, a plan view shape of the measurement mark structure has rotational symmetry having a four-fold axis at a constant angle of 90°.

As another aspect of the present invention, a plan view shape of the measurement area is a square shape, and a center of the square shape coincides with the four-fold axis of the rotational symmetry of the measurement mark structure.

In addition, an imprint mold of the present invention includes a base, an uneven structure area set on a surface of the base, a measurement area set in the uneven structure area, and a measurement mark structure positioned in the measurement area, the measurement mark structure is constituted by a flat portion and a sub-structure positioned around the flat portion, and the sub-structure is a pattern set in which a plurality of fine patterns is arranged.

As another aspect of the present invention, at least one of a width of each of the fine patterns constituting the sub-structure and an interval between the fine patterns is less than a resolution of a position detection apparatus used when a measurement mark formed by the measurement mark structure is detected.

As another aspect of the present invention, the sub-structure has two or more types of the pattern sets, and the pattern set positioned adjacent to the flat portion has a line/space shape.

As another aspect of the present invention, a dimension of the flat portion is not less than a resolution of a position detection apparatus used when a measurement mark formed by the measurement mark structure is detected.

As another aspect of the present invention, a plan view shape of the measurement mark structure has rotational symmetry having a four-fold axis at a constant angle of 90°.

As another aspect of the present invention, a plan view shape of the measurement area is a square shape, and a center of the square shape coincides with the four-fold axis of the rotational symmetry of the measurement mark structure.

An imprint method of the present invention includes a resin supply step of supplying a molded resin to at least one of the above-described mold and a transfer substrate, a contact step of bringing the mold and the transfer substrate close to each other and spreading the molded resin between the mold and the transfer substrate, to form a molded resin layer, a curing step of curing the molded resin layer to form a transfer resin layer to which the uneven structure is transferred, a mold release step of separating the transfer resin layer and the mold from each other and positioning a pattern structure, which is the transfer resin layer, on the transfer substrate, and a detection step of detecting a position of a measurement mark formed together with the pattern structure on an as needed basis after the mold release step.

An imprint mold of the present invention includes a base, an uneven structure area set on a surface of the base, and a measurement area set in the uneven structure area, and a measurement mark structure, a dummy pattern area set so as to surround the measurement mark structure with a desired distance set therebetween, and a dummy uneven structure positioned in the dummy pattern area are provided in the measurement area.

As another aspect of the present invention, a plan view shape of the measurement mark structure has rotational symmetry having a four-fold axis at a constant angle of 90°.

As another aspect of the present invention, a plan view shape of the dummy pattern area has rotational symmetry having a four-fold axis at a constant angle of 90°.

As another aspect of the present invention, the dummy uneven structure has a plurality of dot-shaped depressions or projections or a plurality of depressions or projections in a line/space shape.

As another aspect of the present invention, the dot-shaped depressions or projections or the depressions or the projections in the line/space shape are arranged so as to form density gradation.

As another aspect of the present invention, the dummy uneven structure has a plurality of dot-shaped depressions or projections and a plurality of depressions or projections in a line/space shape.

As another aspect of the present invention, a plan view shape of the dummy uneven structure has rotational symmetry having a two-fold axis at a constant angle of 180°, a plan view shape of the measurement mark structure has rotational symmetry having a four-fold axis at a constant angle of 90°, and the four-fold axis coincides with the two-fold axis of the rotational symmetry of the dummy uneven structure.

As another aspect of the present invention, a plan view shape of the dummy uneven structure has rotational symmetry having a four-fold axis at a constant angle of 90°, a plan view shape of the measurement mark structure has rotational symmetry having a four-fold axis at a constant angle of 90°, and the four-fold axis coincides with the four-fold axis of the rotational symmetry of the dummy uneven structure.

In addition, an imprint method of the present invention includes a resin supply step of supplying a molded resin to at least one of the above-described mold and a transfer substrate, a contact step of bringing the mold and the transfer substrate close to each other and spreading the molded resin between the mold and the transfer substrate, to form a molded resin layer, a curing step of curing the molded resin layer to form a transfer resin layer to which the uneven structure is transferred, a mold release step of separating the transfer resin layer and the mold from each other and positioning a pattern structure, which is the transfer resin layer, on the transfer substrate, and a detection step of detecting a position of a measurement mark formed together with the pattern structure on an as needed basis after the mold release step.

Advantageous Effects of Invention

The imprint mold of the present invention is capable of preventing the deformation occurring in the resin layer at the time of the release of the resin layer from the mold and forming the measurement mark with high accuracy and, with this, it becomes possible to accurately detect the magnitude and the direction of the deviation of the pattern in the formation of the pattern structure by using the mold, modification of the design coordinates and others in mold design is facilitated, and control of correction of pattern accuracy that is performed by giving a desired deformation to the mold at the time of the imprint is facilitated.

The imprint method of the present invention is capable of stably fabricating the high-accuracy pattern structure.

DESCRIPTION OF EMBODIMENTS

Hereinbelow, an embodiment of the present invention will be described with reference to the drawings.

Note that the drawings are schematic or conceptual. The dimensions of each member and the size ratio between the members are not necessarily the same as actual values thereof. Further, the same member may be shown with different dimensions or ratios depending on the drawings.

[Imprint Mold]

Figure 1:
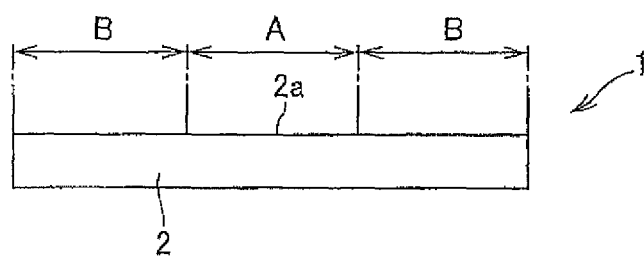
FIG. 1 is a side view for explaining an embodiment of an imprint mold of the present invention.
Figure 2:
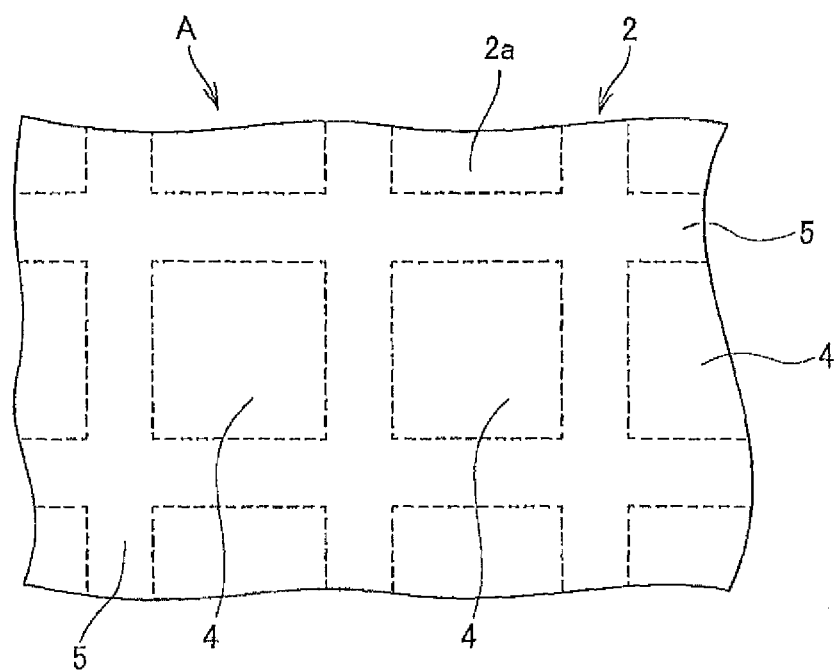
FIG. 2 is a partially enlarged plan view of the imprint mold shown in FIG. 1.

FIG. 1 is a side view for explaining an embodiment of an imprint mold of the present invention, and FIG. 2 is a partially enlarged plan view of the imprint mold shown in FIG. 1. In FIGS. 1 and 2, an imprint mold 1 includes a base 2, and an uneven structure area A and even structure areas B that are set on a surface 2a of the base 2. The uneven structure area A has an uneven structure (not shown) for forming a desired pattern structure by imprint. In the uneven structure area A, main pattern areas 4 and non-main pattern areas 5 are set. The main pattern area 4 is the area that includes the uneven structure for forming the pattern structure serving as a formation target. In the example shown in the drawing, the main pattern areas 4 are set so as to form a grid, and the non-main pattern areas 5 are set vertically and laterally in gap portions of the individual main pattern areas 4 so as to form a lattice. Note that, in FIG. 2, the boundary between the main pattern area 4 and the non-main pattern area 5 is indicated by a chain line. In the present embodiment, a measurement area is set in the non-main pattern area 5 in the uneven structure area A.

Figure 3:
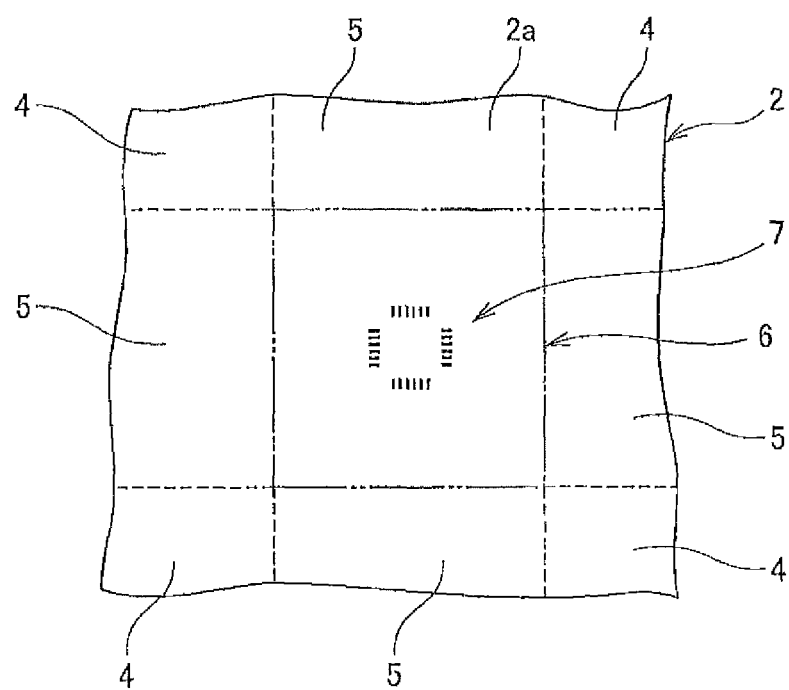
FIG. 3 is an enlarged plan view of an intersection portion of non-main pattern areas in FIG. 2.

FIG. 3 is an enlarged plan view of an intersection portion of the non-main pattern areas 5 in FIG. 2. As shown in FIG. 3, a measurement area 6 is positioned at the intersection portion of the non-main pattern areas 5 that are set so as to form the lattice, and the measurement area 6 has a measurement mark structure 7. Note that the position of the measurement area 6 is not limited to the intersection portion of the non-main pattern areas 5.

In FIG. 3, the outer circumference of the measurement area 6 is indicated by a two-dot chain line. The position of the measurement area 6 set in the uneven structure area A of the mold 1 is not limited to the above position, and can be appropriately set in consideration of the numbers of the main pattern areas 4 and the non-main pattern areas 5 set in the uneven structure area A, the sizes thereof, and the uneven structure provided in the main pattern area 4. In addition, similarly to the above case, the number of the set measurement areas 6 can also be appropriately set in consideration of the numbers of the main pattern areas 4 and the non-main pattern areas 5 set in the uneven structure area A, the sizes thereof, and the uneven structure provided in the main pattern area 4.

Figure 4:
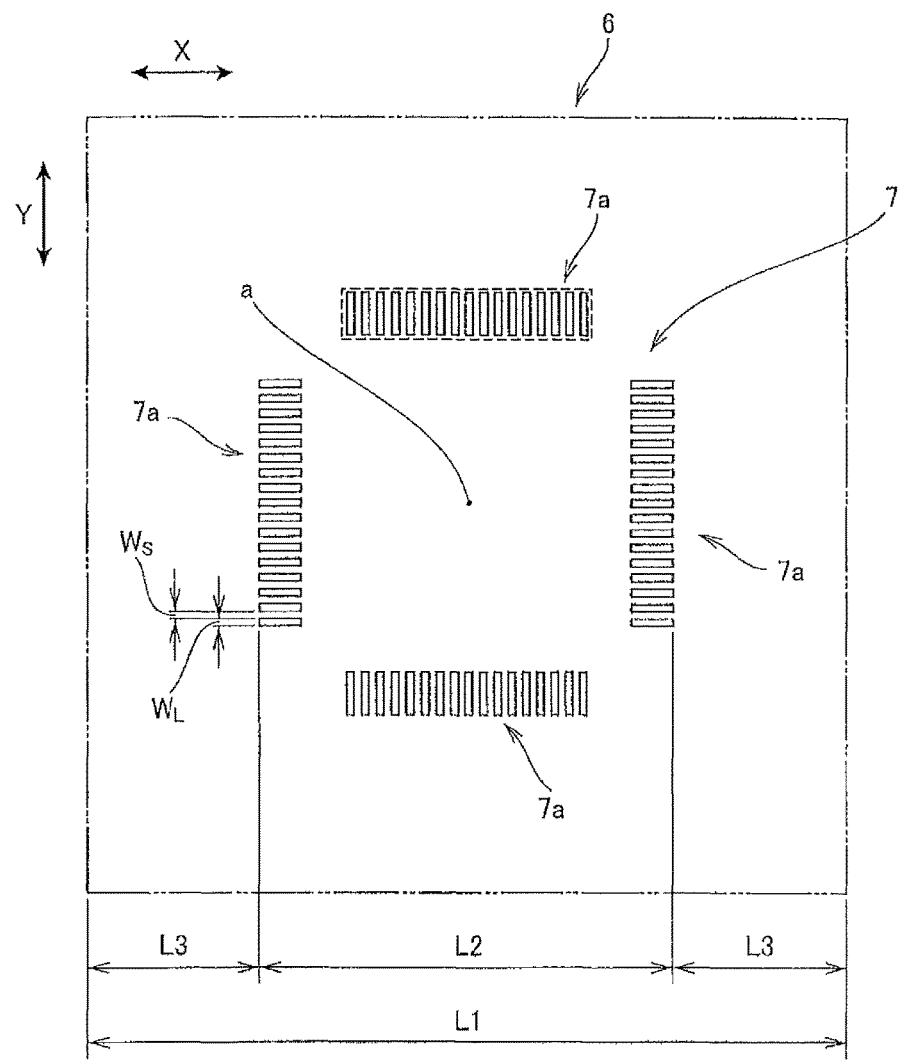
FIG. 4 is an enlarged view of a measurement area shown in FIG. 3.

FIG. 4 is an enlarged view of the measurement area 6 shown in FIG. 3. As shown in FIG. 4, the measurement mark structure 7 has four pattern sets 7a such that the pattern sets 7a are positioned at individual sides of a square shape, and each pattern set 7a has a line/space shape (a shape in which linear depressions or projections each having a predetermined line width $W_L$ are periodically arranged in a direction orthogonal to a longitudinal direction via a space width $W_S$). The plan view shape of the measurement mark structure 7 has rotational symmetry having a four-fold axis a of a constant angle of 90°. The measurement mark structure 7 has the pattern sets having fine patterns described above, whereby a stress that is generated in a resin layer at the time of release of the resin layer from the mold is dispersed and deformation is thereby prevented, and it is possible to form the measurement mark with high accuracy. The plan view shape of the measurement area 6 may be a square shape, and the center of the square shape may coincide with the four-fold axis a of the rotational symmetry of the measurement mark structure 7. With this, an uneven force is prevented from being applied to the measurement mark structure 7 at the time of the mold release, and it is possible to further reduce an influence of the deformation at the time of the mold release.

The plan view shape of the outline of the pattern set 7a is a rectangular shape and, in FIG. 4, the plan view shape of one pattern set 7a is indicated by a chain line. The dimensions of the rectangular shape are not less than the resolution of a position detection apparatus used when the measurement mark formed by the measurement mark structure 7 is detected, and can be appropriately set in a range that falls within a field of view of the position detection apparatus. For example, in the case where 30 μm is set as a common field of view, it is possible to set the dimension in the longitudinal direction to 2 to 22 μm and preferably about 5 to 15 μm, and set the dimension in a width direction to 0.1 to 5 μm and preferably about 0.3 to 1 μm. In particular, the dimension of the pattern set 7a in the width direction is preferably smaller because the pattern set 7a becomes less likely to be influenced by the deformation at the time of the mold release. However, when the dimension thereof in the width direction is extremely small, an area that can be viewed at the time of position detection is reduced and an error is increased, and hence it is preferable to set the dimension thereof in the width direction in consideration of this respect. In the pattern in the line/space shape constituting the pattern set 7a, the longitudinal direction of the line is orthogonal to the longitudinal direction of the pattern set 7a. At least one of the line width $W_L$ and the space width $W_S$ of the pattern in the line/space shape is preferably less than the resolution of the position detection apparatus used when the measurement mark formed by the measurement mark structure 7 is detected. With this, as will be described later, when the measurement mark is detected, it is possible to reliably detect the position of an end portion of a portion corresponding to the pattern set 7a. However, when the position detection is allowed even in the case where pattern resolution is performed by setting of the measurement area 6, the line width $W_L$ and the space width $W_S$ of the pattern in the line/space shape may be not less than the resolution of the position detection apparatus. In addition, the depth of the depression of the line/space shape constituting the pattern set 7a or the height of the projection thereof can be appropriately set in consideration of the depth of the depression of the uneven structure of the main pattern area 4 or the height of the projection thereof. Note that the number of the lines of the line/space shape is not limited to the example shown in the drawing.

An outer dimension L1 of the measurement area 6 described above can be appropriately set in a range of, e.g., about 7 to 100 μm. When the outer dimension L1 is less than 7 μm, the area that can be viewed at the time of the position detection is reduced and the error is increased, which is not preferable. In addition, the upper limit of the outer dimension L1 is not particularly limited but, in order to prevent an influence such as a reduction in the area of the main pattern area caused by enlargement of the measurement area 6, the upper limit of the outer dimension L1 of not more than 100 μm is appropriate. Further, a length L2 of an area in which the pattern sets 7a are positioned may be any length as long as the area falls within the field of view of the position detection apparatus. For example, in the case where 30 μm is set as the common field of view, the length L2 can be set to about 3 to 26 μm. The area that can be viewed at the time of the position detection is reduced and the error is increase when the length L2 is less than 3 μm, and there are cases where the area gets out of the field of view when the length L2 exceeds 26 μm, which is not preferable. Further, a distance L3 between the outer circumferential end of the measurement area 6 and the area in which the pattern sets 7a are positioned can be appropriately set in a range of not less than 2 μm. When the distance L3 is less than 2 μm, there is a possibility that the position detection apparatus cannot accurately capture the area to be viewed. The upper limit of the distance L3 can be appropriately set in accordance with the outer dimension L1 of the measurement area 6 and the length L2 of the area in which the pattern sets 7a are positioned. For example, in the case where 30 μm is set as the common field of view, the upper limit of the distance L3 can be set to 48 μm or less.

As the material of the base 2 of the imprint mold 1, in the case where the molded resin used in the imprint is a photo-curable resin, it is possible to use a material that transmits irradiation light for curing the resin, and, in addition to glass materials such as quartz glass, silicate glass, calcium fluoride, magnesium fluoride, and acrylic glass, it is possible to use, e.g., sapphire, gallium nitride, resins such as polycarbonate, polystyrene, acrylic, and polypropylene, and any laminated material of these. In the case where the molded resin to be used is not the photo-curable resin or in the case where light for curing the molded resin can be emitted from the side of the transfer substrate, the mold 1 may not have light transmissivity and, other than the above materials, it is possible to use, e.g., silicon, metals such as nickel, titanium, and aluminum, alloys, oxides, and nitrides of these, and any laminated material of these.

In addition, in order to facilitate the separation of the mold from the molded resin, a mold release agent layer may be provided on the surface of the uneven structure area A of the mold 1.

The thickness of the base 2 of the mold 1 can be set in consideration of the shape, the strength of the material, and the workability of the uneven structure of the surface 2a, and the thickness thereof can be appropriately set in a range of, e.g., about 300 μm to 10 mm. Note that, in the base 2, the surface of the uneven structure area A may have a projection structure having two or more projections with respect to the even structure area B around the uneven structure area A.

Figure 5:
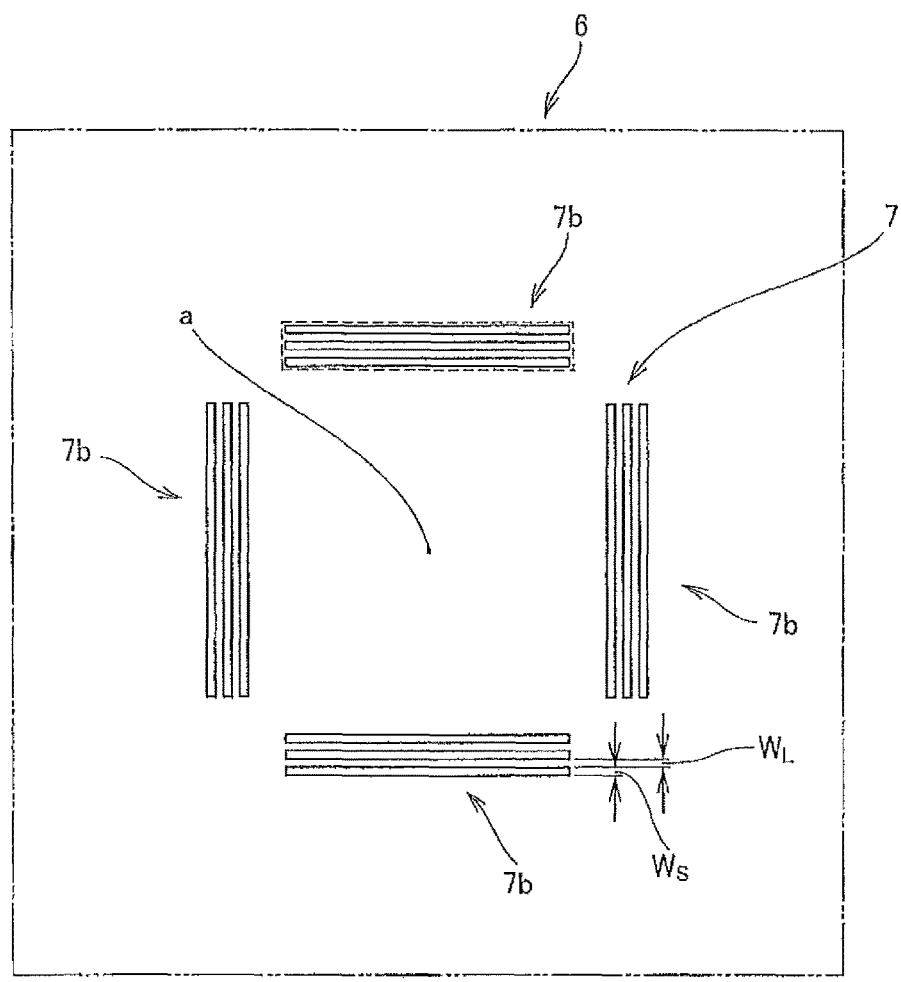
FIG. 5 is a plan view showing another example of a measurement mark structure.

FIG. 5 is a plan view showing another example of the measurement mark structure 7. The measurement mark structure 7 shown in FIG. 5 has four pattern sets 7b such that the pattern sets 7b are positioned at individual sides of a square shape, and each pattern set 7b has the line/space shape. The plan view shape of the measurement mark structure 7 has the rotational symmetry having the four-fold axis a of the constant angle of 90°.

The plan view shape of the outline of the pattern set 7b is a rectangular shape and, in FIG. 5, the plan view shape of one pattern set 7b is indicated by a chain line. The dimensions of the rectangular shape are not less than the resolution of the position detection apparatus used when the measurement mark formed by the measurement mark structure 7 is detected, and can be appropriately set in a range that falls within the field of view of the position detection apparatus. For example, in the case where 30 μm is set as the common field of view, it is possible to set the dimension in the longitudinal direction to 2 to 22 μm and preferably about 5 to 15 μm, and set the dimension in the width direction to 0.1 to 5 μm and preferably about 0.3 to 1 μm. In particular, the dimension of the pattern set 7b in the width direction is preferably smaller because the pattern set 7b becomes less likely to be influenced by the deformation at the time of the mold release. However, when the dimension thereof in the width direction is extremely small, the area that can be viewed at the time of the position detection is reduced and the error is increased, and hence it is preferable to set the dimension thereof in the width direction in consideration of this respect. In addition, in the pattern in the line/space shape constituting the pattern set 7b, the longitudinal direction of the line is parallel with the closest end side of the measurement area 6. The outer dimension L1 of the measurement area 6, the length L2 of the area in which the pattern sets 7b are positioned, and the distance L3 between the outer circumferential end of the measurement area 6 and the area in which the pattern sets 7b are positioned can be appropriately set, e.g., in the same ranges as those described above.

At least one of the line width $W_L$ and the space width $W_S$ of the pattern in the line/space shape can be less than the resolution of the position detection apparatus used when the measurement mark formed by the measurement mark structure 7 is detected. With this, as will be described later, when the measurement mark is detected, it is possible to reliably detect the position of the end portion of the portion corresponding to the pattern set 7b. In addition, it is also possible to set the line width $W_L$ and the space width $W_S$ of the pattern in the line/space shape to values not less than the resolution of the position detection apparatus. In this case, as will be described later, when the measurement mark is detected, it is possible to detect the position of the end portion of each pattern in the line/space shape constituting the portion in addition to the position of the end portion of the portion corresponding to the pattern set 7b, and it is possible to grasp more position data to improve measurement accuracy. The depth of the depression of the line/space shape constituting the pattern set 7b or the height of the projection thereof can be appropriately set in consideration of the depth of the depression of the uneven structure of the main pattern area 4 or the height of the projection thereof. Note that the number of the lines of the line/space shape is not limited to the example shown in the drawing.

Figure 6:
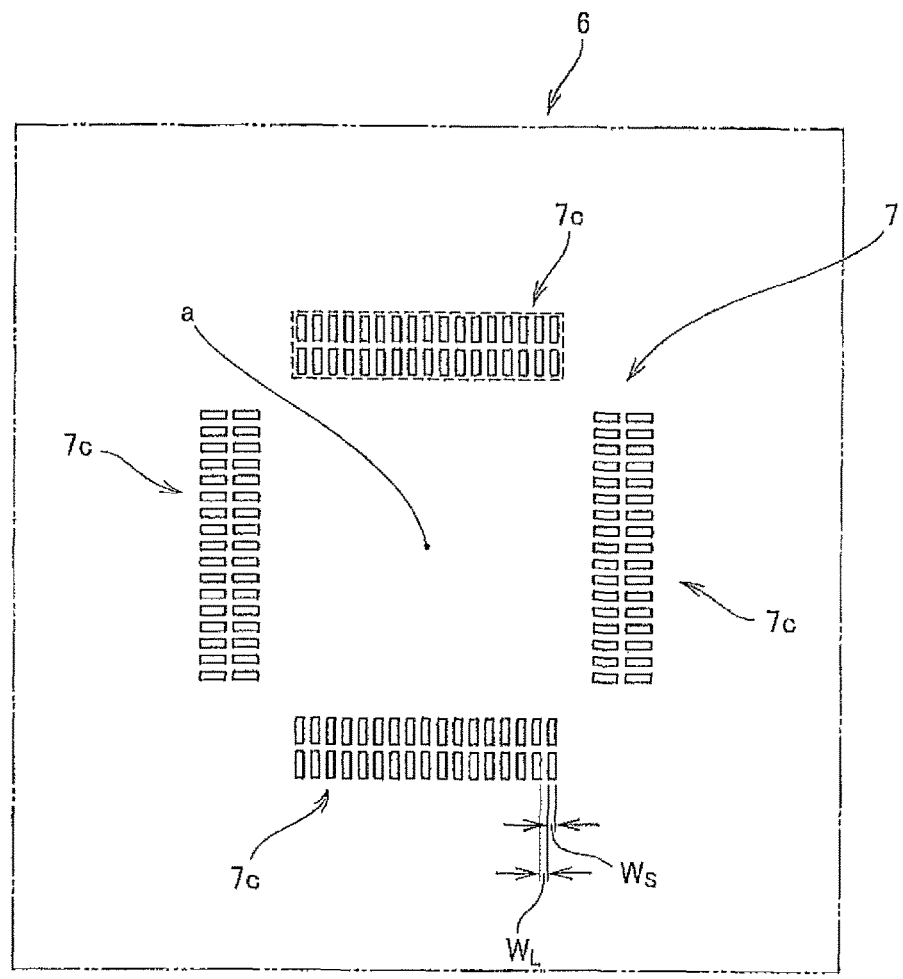
FIG. 6 is a plan view showing another example of the measurement mark structure.

FIG. 6 is a plan view showing another example of the measurement mark structure 7. The measurement mark structure 7 shown in FIG. 6 has four pattern sets 7c such that the pattern sets 7c are positioned at individual sides of a square shape, and the plan view shape of the measurement mark structure 7 has the rotational symmetry having the four-fold axis a of the constant angle of 90°. The plan view shape of the outline of each pattern set 7c is a rectangular shape and, in FIG. 6, the plan view shape of one pattern set 7c is indicated by a chain line. The dimensions of the rectangular shape are not less than the resolution of the position detection apparatus used when the measurement mark formed by the measurement mark structure 7 is detected, and can be appropriately set in a range that falls within the field of view of the position detection apparatus. For example, in the case where 30 μm is set as the common field of view, it is possible to set the dimension in the longitudinal direction to 2 to 22 μm and preferably about 5 to 15 μm, and set the dimension in the width direction to 0.1 to 5 μm and preferably about 0.3 to 1 μm. In particular, the dimension of the pattern set 7c in the width direction is preferably smaller because the pattern set 7c becomes less likely to be influenced by the deformation at the time of the mold release. However, when the dimension thereof in the width direction is extremely small, the area that can be viewed at the time of the position detection is reduced and the error is increased, and hence it is preferable to set the dimension thereof in the width direction in consideration of this respect. In addition, in each pattern set 7c, two patterns each having the line/space shape are disposed in parallel with an interval set therebetween and, in the pattern in the line/space shape, the longitudinal direction of the line is orthogonal to the longitudinal direction of the pattern set 7c. The outer dimension L1 of the measurement area 6, the length L2 of the area in which the pattern sets 7c are positioned, and the distance L3 between the outer circumferential end of the measurement area 6 and the area in which the pattern sets 7c are positioned can be appropriately set, e.g., in the same ranges as those described above.

At least one of the line width $W_L$ and the space width $W_S$ of the pattern in the line/space shape is preferably less than the resolution of the position detection apparatus used when the measurement mark formed by the measurement mark structure 7 is detected. The depth of the depression of the line/space shape constituting the pattern set 7c or the height of the projection thereof can be appropriately set in consideration of the depth of the depression of the uneven structure of the main pattern area 4 or the height of the projection thereof. Note that the number of the patterns each having the line/space shape that are disposed in parallel and constitute one pattern set 7c may also be three or more. In addition, the number of the lines of the line/space shape is not limited to the example shown in the drawing.

Figure 7:
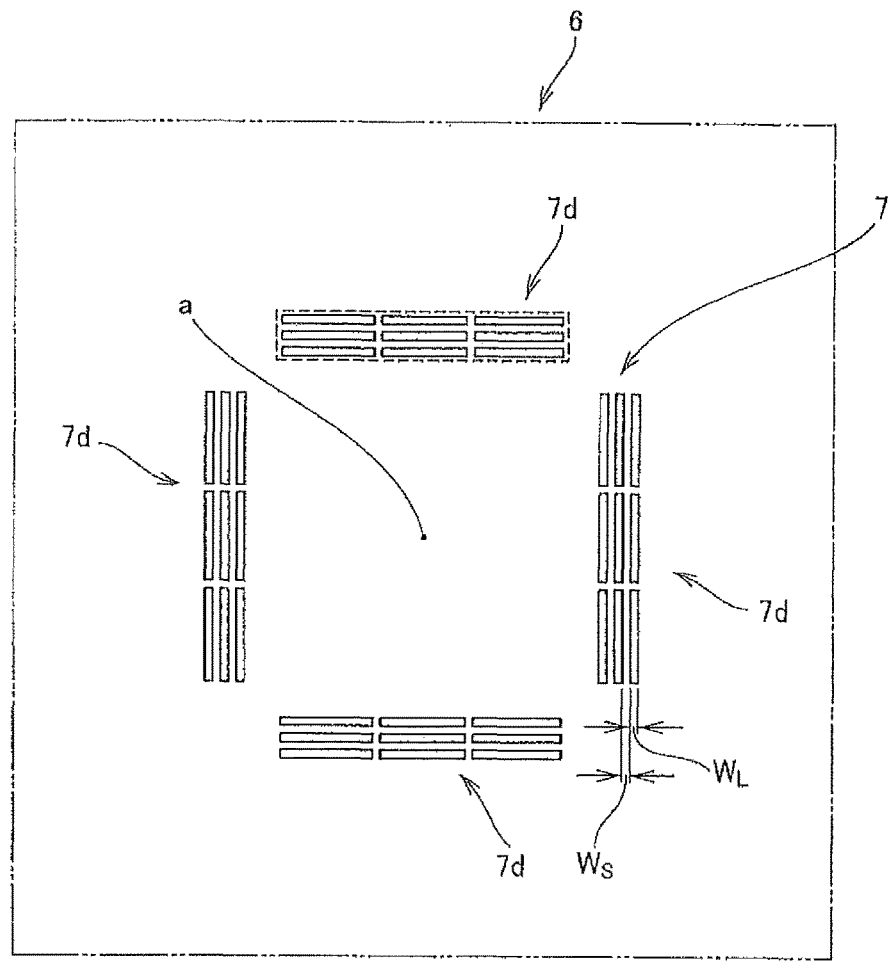
FIG. 7 is a plan view showing another example of the measurement mark structure.

FIG. 7 is a plan view showing another example of the measurement mark structure 7. The measurement mark structure 7 shown in FIG. 7 has four pattern sets 7d such that the pattern sets 7d are positioned at individual sides of a square shape, and the plan view shape of the measurement mark structure 7 has the rotational symmetry having the four-fold axis a of the constant angle of 90°. The plan view shape of the outline of each pattern set 7d is a rectangular shape and, in FIG. 7, the plan view shape of one pattern set 7d is indicated by a chain line. The dimensions of the rectangular shape are not less than the resolution of the position detection apparatus used when the measurement mark formed by the measurement mark structure 7 is detected, and can be appropriately set in a range that falls within the field of view of the position detection apparatus. For example, in the case where 30 µm is set as the common field of view, it is possible to set the dimension in the longitudinal direction to 2 to 22 µm and preferably about 5 to 15 µm, and set the dimension in the width direction to 0.1 to 5 µm and preferably about 0.3 to 1 µm. In particular, the dimension of the pattern set 7d in the width direction is preferably smaller because the pattern set 7d becomes less likely to be influenced by the deformation at the time of the mold release. However, when the dimension thereof in the width direction is extremely small, the area that can be viewed at the time of the position detection is reduced and the error is increased, and hence it is preferable to set the dimension thereof in the width direction in consideration of this respect. In addition, in each pattern set 7d, three patterns each having the line/space shape are disposed in series with intervals set therebetween and, in the pattern in the line/space shape, the longitudinal direction of the line is parallel with the closest end side of the measurement area 6. The outer dimension L1 of the measurement area 6, the length L2 of the area in which the pattern sets 7d are positioned, and the distance L3 between the outer circumferential end of the measurement area 6 and the area in which the pattern sets 7d are positioned can be appropriately set, e.g., in the same ranges as those described above.

At least one of the line width $W_L$ and the space width $W_S$ of the pattern in the line/space shape may be less than the resolution of the position detection apparatus used when the measurement mark formed by the measurement mark structure 7 is detected, and the line width $W_L$ and the space width $W_S$ may also be not less than the resolution of the position detection apparatus. The depth of the depression of the line/space shape constituting the pattern set 7d or the height of the projection thereof can be appropriately set in consideration of the depth of the depression of the uneven structure of the main pattern area 4 or the height of the projection thereof. Note that the number of the patterns each having the line/space shape that are disposed in series and constitute one pattern set 7d may be two or may also be four or more. In addition, the number of the lines of the line/space shape is not limited to the example shown in the drawing.

Figure 8:
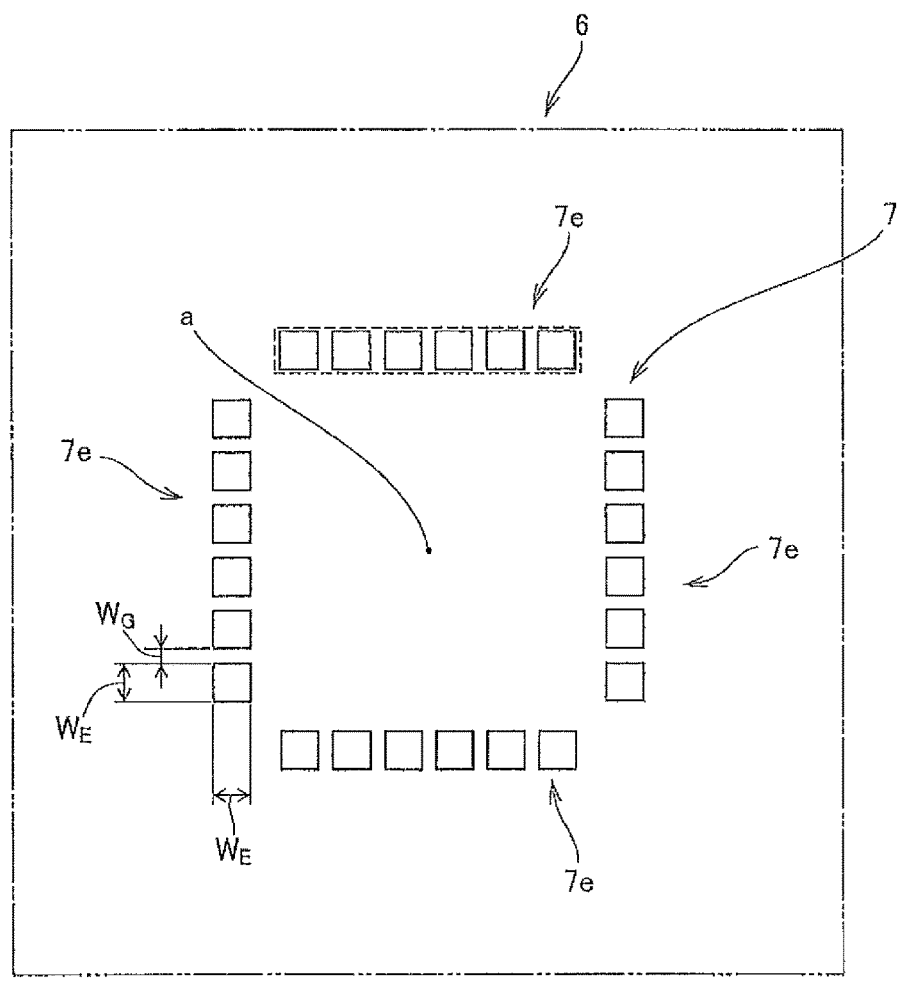
FIG. 8 is a plan view showing another example of the measurement mark structure.

FIG. 8 is a plan view showing another example of the measurement mark structure 7. The measurement mark structure 7 shown in FIG. 8 has four pattern sets 7e such that the pattern sets 7e are positioned at individual sides of a square shape, and the plan view shape of the measurement mark structure 7 has the rotational symmetry having the four-fold axis a of the constant angle of 90°. The plan view shape of the outline of each pattern set 7e is a rectangular shape and, in FIG. 8, the plan view shape of one pattern set 7e is indicated by a chain line. The dimensions of the rectangular shape are not less than the resolution of the position detection apparatus used when the measurement mark formed by the measurement mark structure 7 is detected, and can be appropriately set in a range that falls within the field of view of the position detection apparatus. For example, in the case where 30 µm is set as the common field of view, it is possible to set the dimension in the longitudinal direction to 2 to 22 µm and preferably about 5 to 15 and set the dimension in the width direction to 0.1 to 5 µm and preferably about 0.3 to 1 µm. In particular, the dimension of the pattern set 7e in the width direction is preferably smaller because the pattern set 7e becomes less likely to be influenced by the deformation at the time of the mold release. However, when the dimension thereof in the width direction is extremely small, the area that can be viewed at the time of the position detection is reduced and the error is increased, and hence it is preferable to set the dimension thereof in the width direction in consideration of this respect. In addition, each pattern set 7e is the set of patterns each having the plan view shape having the rotational symmetry having the four-fold axis at the constant angle of 90° and, in the example shown in the drawing, a plurality of patterns each having a square plan view shape are disposed in series with intervals set therebetween so as to be parallel with the closest end side of the measurement area 6. The outer dimension L1 of the measurement area 6, the length L2 of the area in which the pattern sets 7e are positioned, and the distance L3 between the outer circumferential end of the measurement area 6 and the area in which the pattern sets 7e are positioned can be appropriately set, e.g., in the same ranges as those described above.

Figure 9:
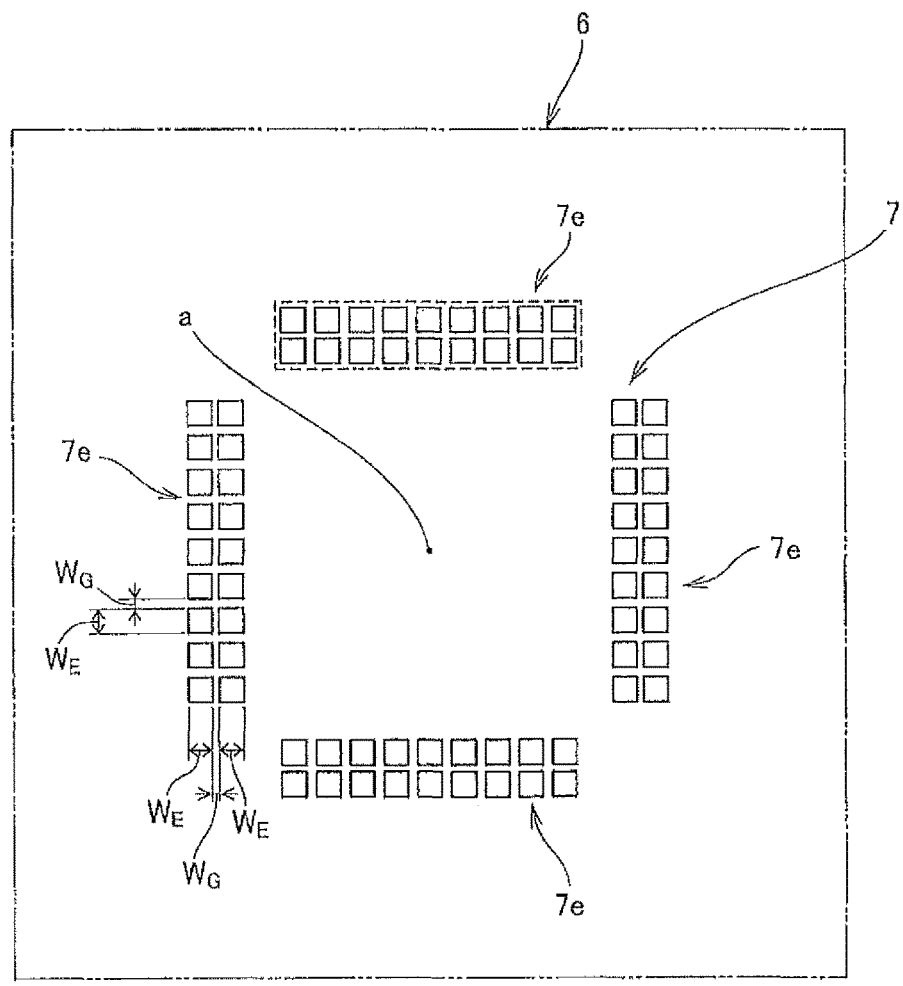
FIG. 9 is a plan view showing another example of the measurement mark structure.

An interval $W_G$ between adjacent square patterns that constitute each pattern set 7e is less than the resolution of the position detection apparatus used when the measurement mark formed by the measurement mark structure 7 is detected. In addition, a length $W_E$ of one side of each square pattern determines the length of the short side of the plan view shape (rectangular shape) of the pattern set 7e, and is not less than the resolution of the position detection apparatus. The depth of the depression of the square pattern constituting the pattern set 7e or the height of the projection thereof can be appropriately set in consideration of the depth of the depression of the uneven structure of the main pattern area 4 or the height of the projection thereof. Note that the number of the square patterns constituting one pattern set 7e is not limited to the example shown in the drawing. In addition, as shown in FIG. 9, the square patterns constituting one pattern sets 7e may be disposed in series in two rows with an interval set therebetween so as to be parallel with the closest end side of the measurement area 6. In this case, the interval $W_G$ between the adjacent square patterns that constitute each pattern set 7e is less than the resolution of the position detection apparatus used when the measurement mark formed by the measurement mark structure 7 is detected. Further, the length of the short side of the rectangular shape as the plan view shape of the outline of each pattern set 7e only needs to be not less than the resolution of the position detection apparatus, and the length $W_E$ of one side of each of the square patterns disposed in two rows may be not less than or less than the resolution of the position detection apparatus. Note that, in FIG. 9, the plan view shape of one pattern set 7e is indicated by a chain line.

Figure 10:
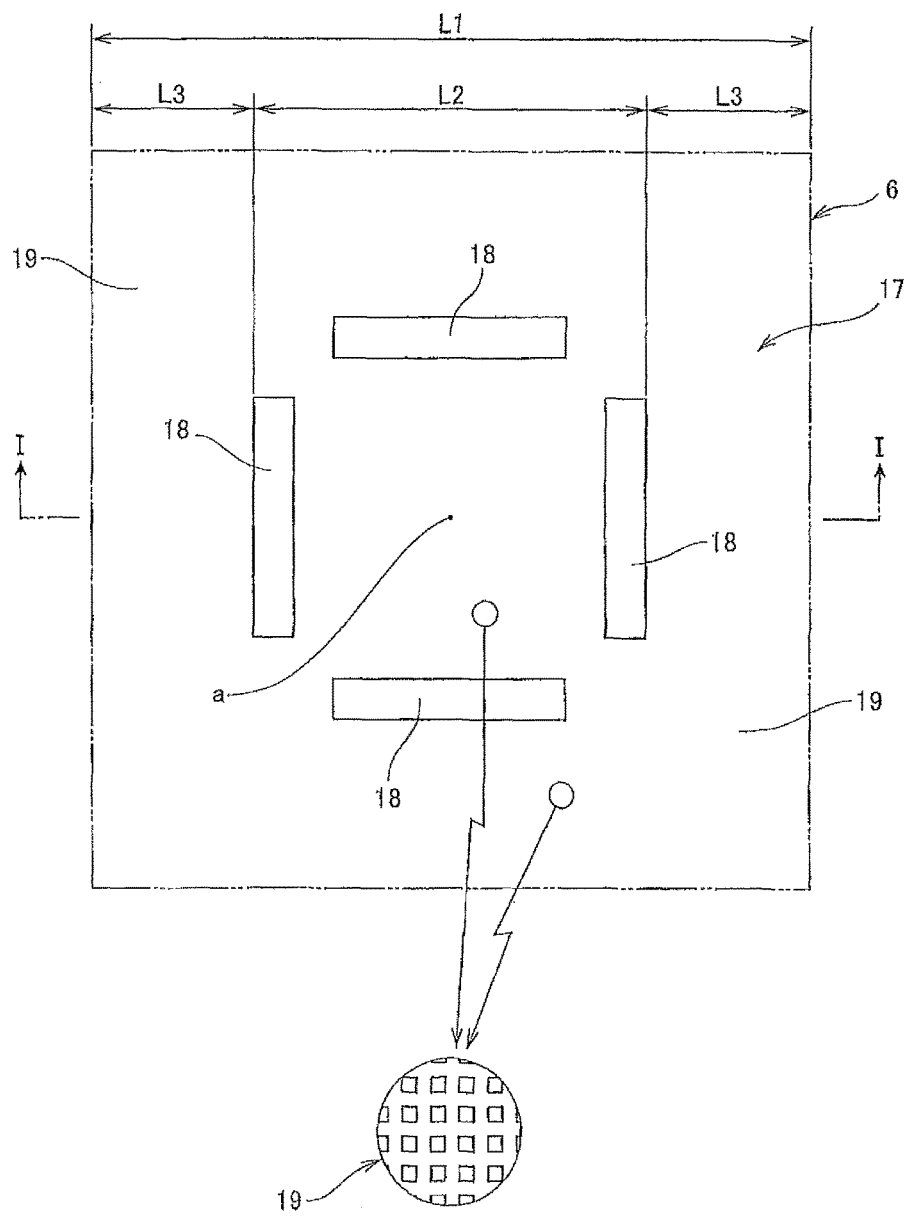
FIG. 10 is a plan view showing another example of the measurement mark structure of the imprint mold of the present invention.
Figure 11A:
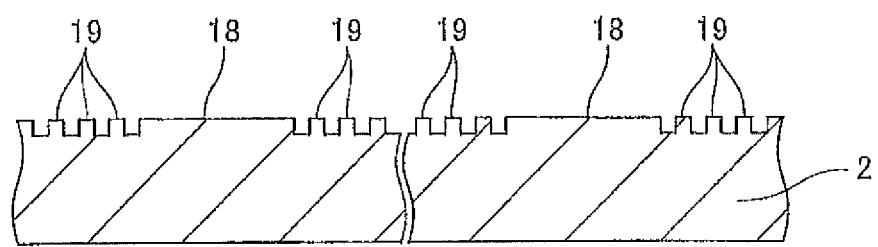
FIGS. 11A and 11B are partial cross-sectional views taken along the I-I line of the mold shown in FIG. 10.
Figure 11B:
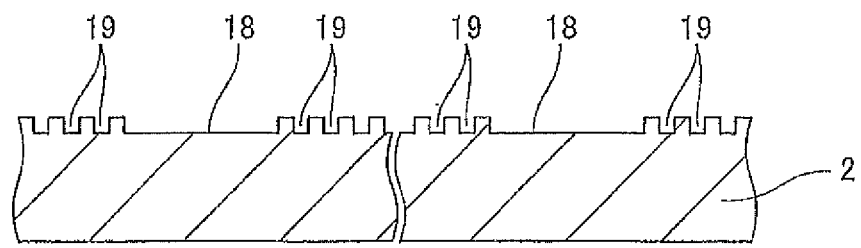

FIG. 10 is a plan view showing another example of the measurement mark structure of the imprint mold of the present invention, and FIGS. 11A and 11B are partial cross-sectional views taken along the I-I line of the mold shown in FIG. 10. In FIG. 10 and FIGS. 11A and 11B, a measurement mark structure 17 is constituted by four flat portions 18 each having a rectangular plan view shape and a sub-structure 19 positioned around the flat portions 18, and the sub-structure 19 is a pattern set in which a plurality of dot-shaped depressions or projections are arranged at a predetermined pitch. The plan view shape of the measurement mark structure 17 has the rotational symmetry having the four-fold axis a of the constant angle of 90°. Note that, in FIG. 10, part of the sub-structure 19 is extracted and enlarged. In addition, the sub-structure 19 is a set of a plurality of dot-shaped projection patterns in a cross-sectional shape shown in FIG. 11A, and is a set of a plurality of dot-shaped depression patterns in a cross-sectional shape shown in FIG. 11B.

The dimensions of the flat portion 18 constituting the measurement mark structure 17 are not less than the resolution of the position detection apparatus used when the measurement mark formed by the measurement mark structure 17 is detected, and can be appropriately set in a range that falls within the field of view of the position detection apparatus. For example, in the case where 30 μm is set as the common field of view, it is possible to set the dimension in the longitudinal direction to 2 to 22 μm and preferably about 5 to 15 μm, and set the dimension in the width direction to 0.1 to 5 μm and preferably about 0.3 to 1 μm. In addition, the plan view shape of the measurement area 6 may be a square shape, and the center of the square shape may coincide with the four-fold axis a of the rotational symmetry of the measurement mark structure 17. With this, the uneven force is prevented from being applied to the measurement mark structure 17 at the time of the mold release, and it is possible to further reduce the influence of the deformation at the time of the mold release.

Further, the sub-structure 19 constituting the measurement mark structure 17 achieves an effect of preventing the measurement mark formed by the measurement mark structure 17 from being deformed to be thicker, thinner, or bent in the release of the molded resin from the mold. The outer dimension L1 of the measurement area 6 can be set such that the sub-structure 19 exerts such an effect, and can be appropriately set in a range of, e.g., about 7 to 100 μm. When the outer dimension L1 is less than 7 μm, the area that can be viewed at the time of the position detection is reduced and the error is increased, which is not preferable. The upper limit of the outer dimension L1 is not particularly limited but, in order to prevent the influence such as the reduction in the area of the main pattern area caused by enlargement of the measurement area 6, the upper limit of the outer dimension L1 of not more than 100 μm is appropriate. The length L2 of the area in which the flat portions 18 are provided may be any length as long as the area falls within the field of view of the position detection apparatus. For example, in the case where 30 μm is set as the common field of view, it is possible to set the length L2 to about 3 to 26 μm. The area that can be viewed at the time of the position detection is reduced and the error is increased when the length L2 is less than 3 μm, and there are cases where the area gets out of the field of view when the length L2 exceeds 26 μm, which is not preferable. Further, the distance L3 between the outer circumferential end of the measurement area 6 and the area in which the flat portions 18 are provided can be appropriately set in a range of not less than 2 μm. When the distance L3 is less than 2 μm, there is a possibility that the position detection apparatus cannot accurately capture the area to be viewed. The upper limit of the distance L3 can be appropriately set in accordance with the outer dimensions L1 of the measurement area 6 and the length L2 of the area in which the flat portions 18 are provided. For example, in the case where 30 μm is set as the common field of view, the upper limit thereof can be set to 48 or less.

As described above, the sub-structure 19 is the set of the plurality of the dot-shaped projection patterns in the cross-sectional shape shown in FIG. 11A, and is the set of the plurality of the dot-shaped depression patterns in the cross-sectional shape shown in FIG. 11B. Note that the flat portion 18 constituting the measurement mark structure 17 is the projection in FIG. 11A and is the depression in FIG. 11B, but the flat portion 18 can be set appropriately. The inner diameter of the dot-shaped depression constituting the sub-structure 19 or the diameter of the projection, and the arrangement pitch of the dot shape can be set such that the deformation of the measurement mark formed by the measurement mark structure 17 can be prevented. For example, the inner diameter of the dot-shaped depression or the diameter of the projection can be appropriately set in a range of about 0.05 to 1 μm and the arrangement pitch of the dot-shaped depression or projection can be appropriately set in a range of about 0.1 to 2 μm, and these dimensions are preferably less than the resolution of the position detection apparatus that detects the measurement mark. The plan view shape of the dot-shaped depression or projection is not particularly limited, and can be appropriately set so as to have a square shape, a circular shape, or a square shape with four rounded corners.

Figure 12:
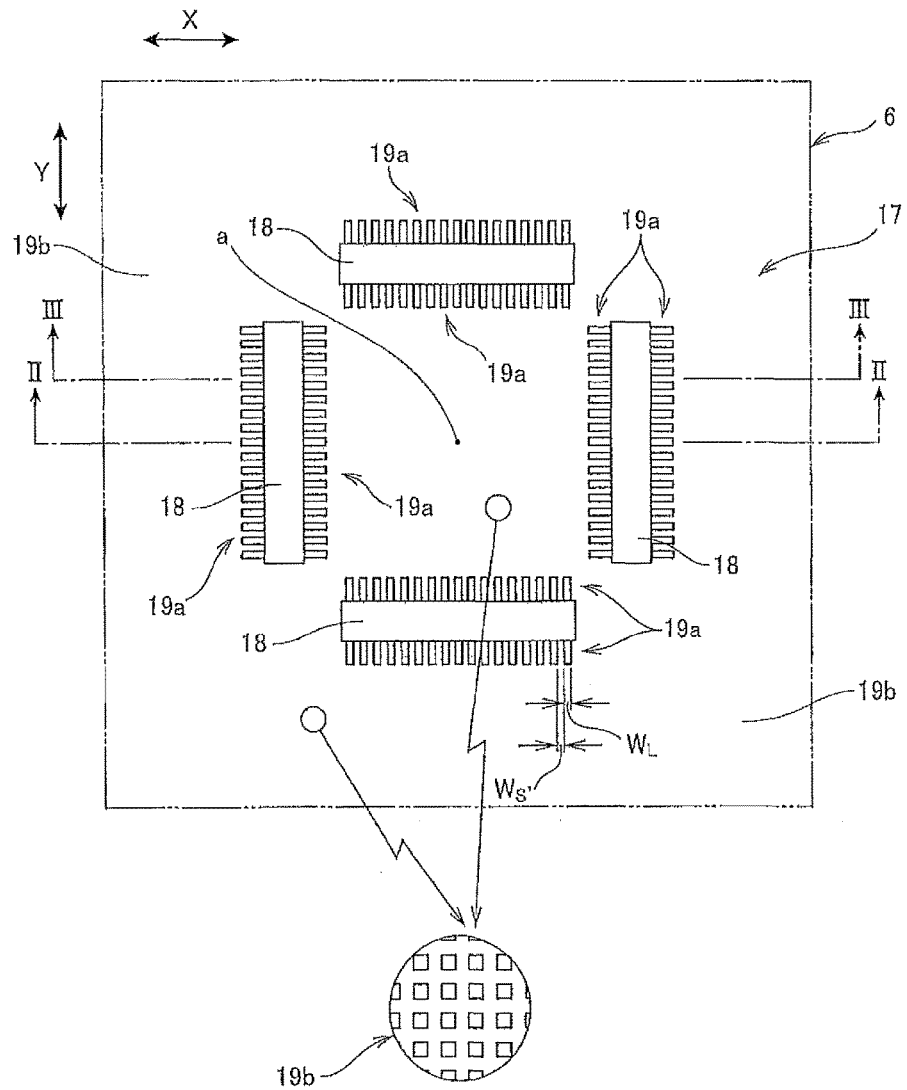
FIG. 12 is a plan view showing another example of the measurement mark structure of the imprint mold of the present invention.
Figure 13A:
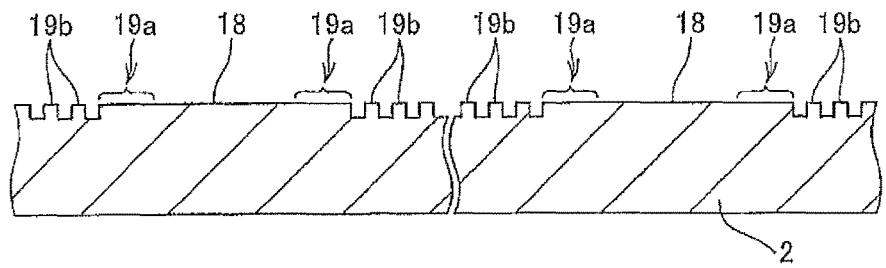
FIGS. 13A and 13C are partial cross-sectional views taken along the line II-II of the mold shown in FIG. 12, and FIGS. 13B and 13D are partial cross-sectional views taken along the line III-III of the mold shown in FIG. 12.
Figure 13B:
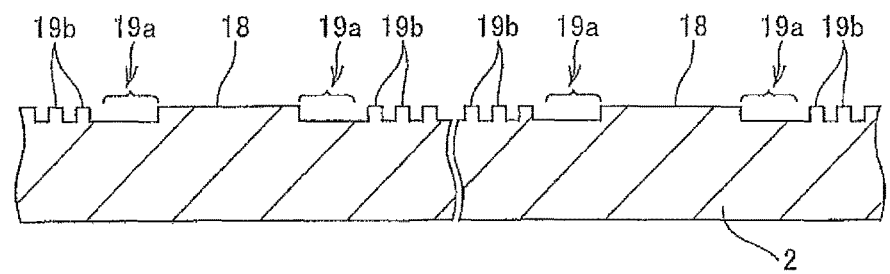
Figure 13C:
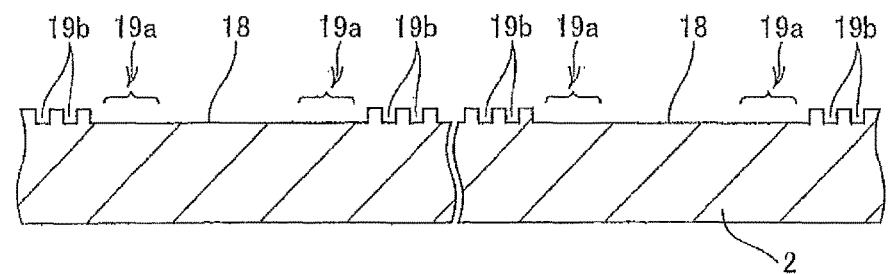
Figure 13D:
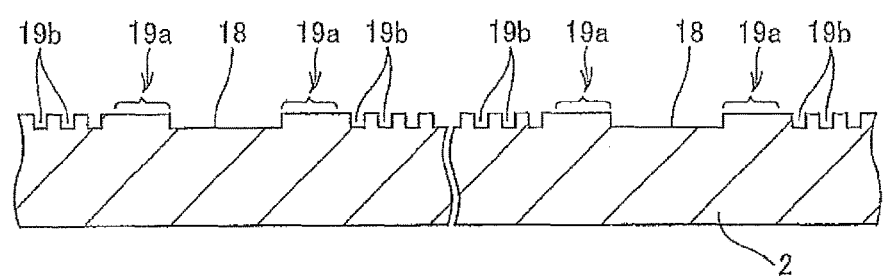

FIG. 12 is a plan view showing another example of the measurement mark structure of the imprint mold of the present invention, FIGS. 13A and 13C are partial cross-sectional views taken along the line II-II of the mold shown in FIG. 12, and FIGS. 13B and 13D are partial cross-sectional views taken along the line of the mold shown in FIG. 12. In FIG. 12 and FIGS. 13A to 13D, the measurement mark structure 17 is constituted by four flat portions 18 each having a rectangular plan view shape and a sub-structure 19 positioned around the flat portions 18. The sub-structure 19 has pattern sets 19a each as the line/space shape (a shape in which linear depressions or projections each having a predetermined line width $W_L$ are periodically arranged in a direction orthogonal to a longitudinal direction via a space width $W_S$) positioned along the long sides of the individual rectangular flat portions 18, and a pattern set 19b that is positioned around the flat portions 18 and the pattern sets 19a and in which a plurality of dot-shaped depressions or projections are arranged at a predetermined pitch. The plan view shape of the measurement mark structure 17 has the rotational symmetry having the four-fold axis a of the constant angle of 90°. Note that, in FIG. 12, part of the pattern set 19b constituting the sub-structure 19 is extracted and enlarged.

The dimensions of the flat portion 18 constituting the measurement mark structure 17 are not less than the resolution of the position detection apparatus used when the measurement mark formed by the measurement mark structure 17 is detected, and can be appropriately set in a range that falls within the field of view of the position detection apparatus. For example, in the case where 30 μm is set as the common field of view, it is possible to set the dimension in the longitudinal direction to 2 to 22 μm and preferably about 5 to 15 vim, and set the dimension in the width direction to 0.1 to 5 μm and preferably about 0.3 to 1 μm. Note that the flat portion 18 constituting the measurement mark structure 17 is the projection in each of FIGS. 13A and 13B and is the depression in each of FIGS. 13C and 13D as shown below, but the flat portion 18 can be set appropriately.

In addition, the sub-structure 19 constituting the measurement mark structure 17 prevents the measurement mark formed by the measurement mark structure 17 from being deformed to be thicker, thinner, or bent in the release of the molded resin from the mold. The outer dimension L1 of the measurement area 6, the length L2 of the area in which the flat portions 18 are provided, and the distance L3 between the outer circumferential end of the measurement area 6 and the area in which the flat portions 18 are provided can be set such that the sub-structure 19 exerts such an effect, and can be appropriately set in the same ranges as those described above. The sub-structure 19 is the projection in the example shown in each of FIG. 13A as the cross-sectional view taken along the line II-II of FIG. 12 and FIG. 13B as the cross-sectional view taken along the line of FIG. 12, and hence the line portion of the pattern set 19a in the line/space shape is the projection, and the pattern set 19b is the set of a plurality of dot-shaped projection patterns. In addition, the sub-structure 19 is the depression in the example shown in each of FIG. 13C as the cross-sectional view taken along the line II-II of FIG. 12 and FIG. 13D as the cross-sectional view taken along the line III-III of FIG. 12, and hence the line portion of the pattern set 19a in the line/space shape is the depression, and the pattern set 19b is the set of a plurality of dot-shaped depression patterns.

As described above, in the pattern in the line/space shape of the pattern set 19a constituting the sub-structure 19, the longitudinal direction of the line is orthogonal to the longitudinal direction of the flat portion 18. At least one of the line width $W_L$ and the space width $W_S$ of the pattern in the line/space shape is preferably less than the resolution of the position detection apparatus used when the measurement mark formed by the flat portions 18 of the measurement mark structure 17 is detected. With this, as will be described later, when the measurement mark is detected, it is possible to reliably detect the position of the end portion of the portion corresponding to the flat portion 18.

In addition, the inner diameter of the dot-shaped depression of the pattern set 19b constituting the sub-structure 19 or the diameter of the projection, and the arrangement pitch of the dot shape can be set such that the deformation of the measurement mark formed by the measurement mark structure 17 can be prevented. For example, the inner diameter of the dot-shaped depression or the diameter of the projection can be appropriately set in a range of about 0.05 to 1 µm and the arrangement pitch of the dot-shaped depression or projection can be appropriately set in a range of about 0.1 to 2 µm, and these dimensions are preferably less than the resolution of the position detection apparatus that detects the measurement mark. In addition, the plan view shape of the dot-shaped depression or projection is not particularly limited, and can be appropriately set so as to have a square shape, a circular shape, or a square shape with four rounded corners.

The depth of the depression in the sub-structure 19 described above or the height of the projection therein can be appropriately set in consideration of the depth of the depression of the uneven structure of the main pattern area 4 or the height of the projection thereof. Note that the number of the lines of the line/space shape of the pattern set 19a is not limited to the example shown in the drawing.

Figure 14:
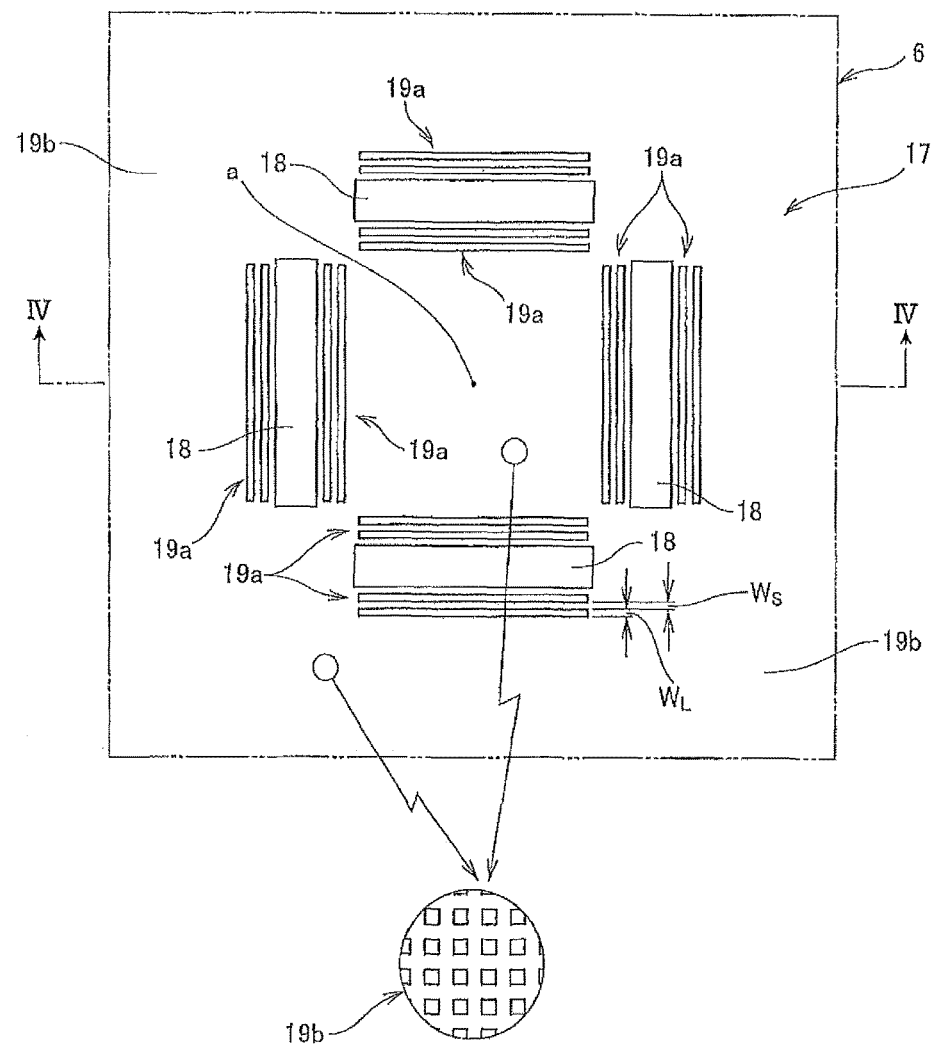
FIG. 14 is a plan view showing another example of the measurement mark structure of the imprint mold of the present invention.
Figure 15A:
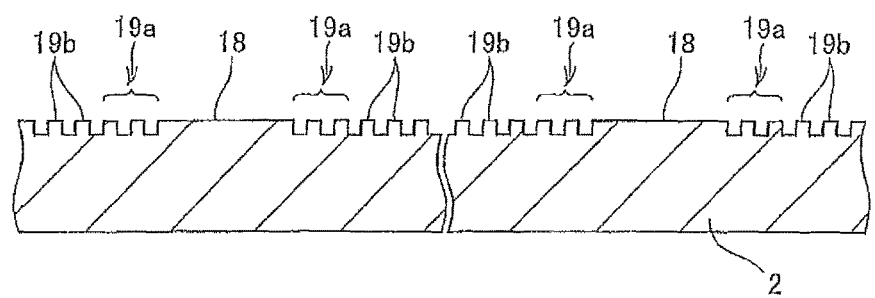
FIGS. 15A and 15B are partial cross-sectional views taken along the line IV-IV of the mold shown in FIG. 14.
Figure 15B:
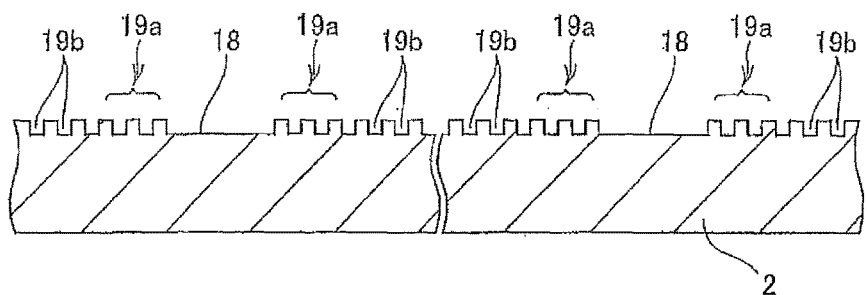

FIG. 14 is a plan view showing another example of the measurement mark structure of the imprint mold of the present invention, and FIGS. 15A and 15B are partial cross-sectional views taken along the line IV-IV of the mold shown in FIG. 14. In FIG. 14 and FIGS. 15A and 15B, the measurement mark structure 17 is constituted by four flat portions 18 each having a rectangular plan view shape, and a sub-structure 19 positioned around the flat portions 18. The sub-structure 19 has pattern sets 19a each as the line/space shape (a shape in which linear depressions or projections each having a predetermined line width $W_L$ are periodically arranged in a direction orthogonal to a longitudinal direction via a space width $W_S$) positioned along the long sides of the individual rectangular flat portions 18, and a pattern set 19b that is positioned around the flat portions 18 and the pattern sets 19a and in which a plurality of dot-shaped depressions or projections are arranged at a predetermined pitch. The plan view shape of the measurement mark structure 17 has the rotational symmetry having the four-fold axis a of the constant angle of 90°. Note that, in FIG. 14, part of the pattern set 19b constituting the sub-structure 19 is extracted and enlarged.

The dimensions of the flat portion 18 constituting the measurement mark structure 17 are not less than the resolution of the position detection apparatus used when the measurement mark formed by the measurement mark structure 17 is detected, and can be appropriately set in a range that falls within the field of view of the position detection apparatus. For example, in the case where 30 µm is set as the common field of view, it is possible to set the dimension in the longitudinal direction to 2 to 22 µm and preferably about 5 to 15 µm, and set the dimension in the width direction to 0.1 to 5 µm and preferably about 0.3 to 1 µm. Note that the flat portion 18 constituting the measurement mark structure 17 is the projection in FIG. 15A and is the depression in FIG. 15B, but the flat portion 18 can be set appropriately.

In addition, the sub-structure 19 constituting the measurement mark structure 17 prevents the measurement mark formed by the measurement mark structure 17 from being deformed to be thicker, thinner, or bent in the release of the molded resin from the mold. The outer dimension L1 of the measurement area 6, the length L2 of the area in which the flat portions 18 are provided, and the distance L3 between the outer circumferential end of the measurement area 6 and the area in which the flat portions 18 are provided can be set such that the sub-structure 19 exerts such an effect, and can be appropriately set, e.g., in the same ranges as those described above. The sub-structure 19 is the projection in the cross-sectional shape shown in FIG. 15A, and hence the line portion of the pattern set 19a in the line/space shape is the projection, and the pattern set 19b is the set of a plurality of dot-shaped projection patterns. In addition, the sub-structure 19 is the depression in the cross-sectional shape shown in FIG. 15B, and hence the line portion of the pattern set 19a in the line/space shape is the depression, and the pattern set 19b is the set of a plurality of dot-shaped depression patterns.

As described above, in the pattern in the line/space shape of the pattern set 19a constituting the sub-structure 19, the longitudinal direction of the line matches the longitudinal direction of the flat portion 18. At least one of the line width $W_L$ and the space width $W_S$ of the pattern in the line/space shape is preferably less than the resolution of the position detection apparatus used when the measurement mark formed by the measurement mark structure 17 is detected. With this, as will be described later, when the measurement mark is detected, it is possible to reliably detect the position of the end portion of the portion corresponding to the flat portion 18. In addition, it is also possible to set the line width $W_L$ and the space width $W_S$ of the pattern in the line/space shape to values not less than the resolution of the position detection apparatus. In this case, as will be described later, when the measurement mark is detected, it is possible to detect the position of the end portion of each pattern in the line/space shape corresponding to the pattern set 19a in addition to the position of the end portion of the portion corresponding to the flat portion 18, and it is possible to grasp more position data to improve the measurement accuracy.

In addition, the inner diameter of the dot-shaped depression of the pattern set 19b constituting the sub-structure 19 or the diameter of the projection, and the arrangement pitch of the dot shape can be set such that the deformation of the measurement mark formed by the measurement mark structure 17 can be prevented. For example, the inner diameter of the dot-shaped depression or the diameter of the projection can be appropriately set in a range of about 0.05 to 1 μm and the arrangement pitch of the dot-shaped depression or projection can be appropriately set in a range of about 0.1 to 2 μm, and these dimensions are preferably less than the resolution of the position detection apparatus that detects the measurement mark. In addition, the plan view shape of the dot-shaped depression or projection is not particularly limited, and can be appropriately set so as to have a square shape, a circular shape, or a square shape with four rounded corners.

The depth of the depression in the sub-structure 19 or the height of the projection therein can be appropriately set in consideration of the depth of the depression of the uneven structure of the main pattern area 4 or the height of the projection thereof. Note that the number of the lines of the line/space shape of the pattern set 19*a* is not limited to the example shown in the drawing.

The imprint mold of the present invention described above is capable of preventing the deformation occurring at the time of the mold release of the molded resin after being cured and the mold to form the measurement mark with high accuracy and, with this, it becomes possible to accurately detect the magnitude and the direction of deviation of the pattern in the formation of the pattern structure by using the mold, modification of design coordinates or the like in mold design is facilitated, and control of correction of pattern accuracy that is performed by giving a desired deformation to the mold at the time of the imprint is facilitated.

The embodiment of the imprint mold described above is only exemplary, and the present invention is not limited to the embodiment. For example, other than the measurement area 6 described above, an area in which the uneven structure or the like for facilitating separation of the mold from the molded resin and preventing the deformation of the pattern structure formed in the main pattern area 4 is provided may also be set in the non-main pattern area 5.

Figure 16:
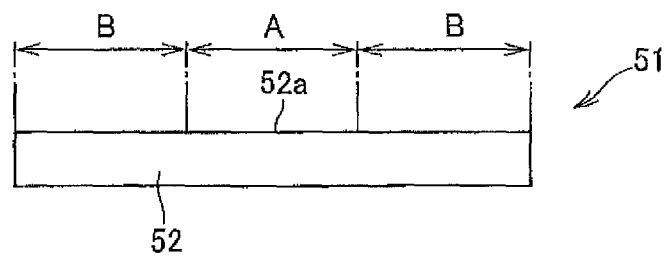
FIG. 16 is a side view for explaining an embodiment of the imprint mold of the present invention.
Figure 17:
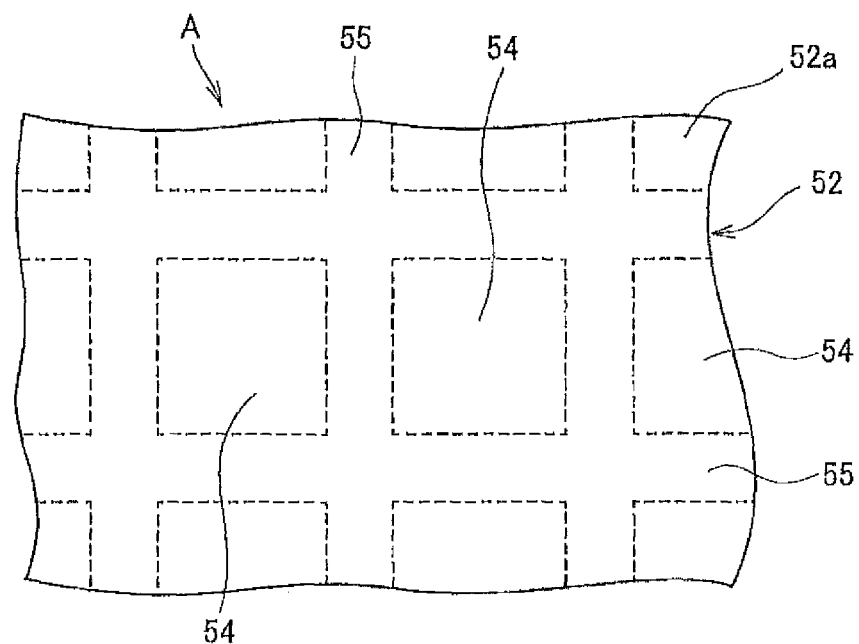
FIG. 17 is a partially enlarged plan view of the imprint mold shown in FIG. 16.

FIG. 16 is a side view for explaining another embodiment of the imprint mold of the present invention, and FIG. 17 is a partially enlarged plan view of the imprint mold shown in FIG. 16. In FIGS. 16 and 17, an imprint mold 51 includes a base 52, and an uneven structure area A and even structure areas B that are set on a surface 52*a* of the base 52. The uneven structure area A has an uneven structure (not shown) for forming a desired pattern structure by imprint. In the uneven structure area A, main pattern areas 54 and non-main pattern areas 55 are set. The main pattern area 54 is the area that includes the uneven structure for forming the pattern structure serving as a formation target. In the example shown in the drawing, the main pattern areas 54 are set so as to form a grid, and the non-main pattern areas 55 are set vertically and laterally in gap portions of the individual main pattern areas 54 so as to form a lattice. Note that, in FIG. 17, the boundary between the main pattern area 54 and the non-main pattern area 55 is indicated by a chain line. In the present embodiment, the measurement area is set in the non-main pattern area 55 in the uneven structure area A.

Figure 18:
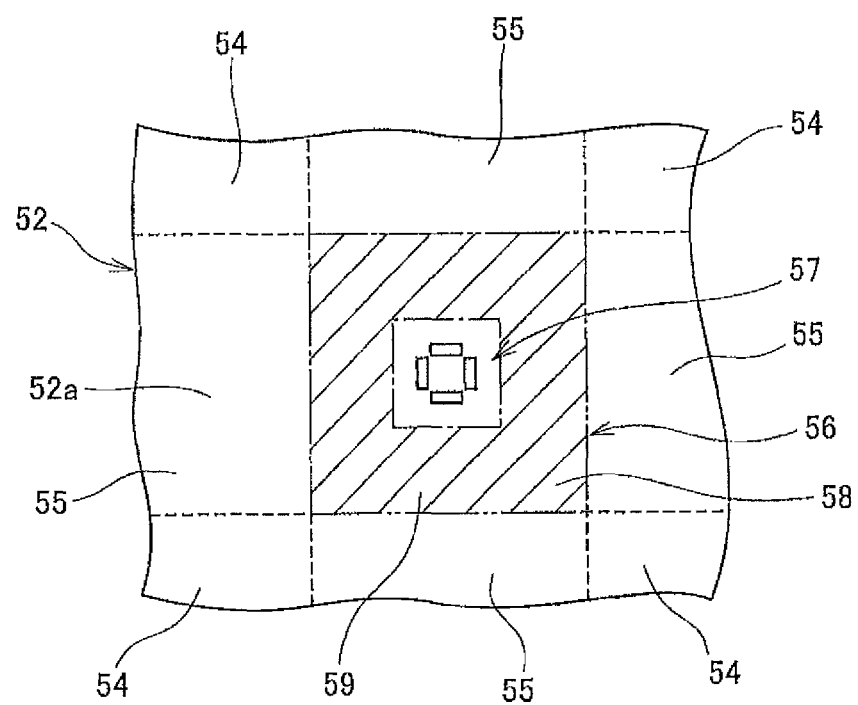
FIG. 18 is an enlarged plan view of the intersection portion of the non-main pattern areas in FIG. 17.

FIG. 18 is an enlarged plan view of an intersection portion of the non-main pattern areas 55 in FIG. 17. As shown in FIG. 18, a measurement area 56 is positioned at the intersection portion of the non-main pattern areas 55 that are set so as to form the lattice. Note that the position of the measurement area 56 is not limited to the intersection portion of the non-main pattern areas 55.

In FIG. 18, the outer circumference of the measurement area 56 is indicated by a two-dot chain line. The measurement area 56 has a measurement mark structure 57, and a dummy pattern area 58 (indicated by hatching in FIG. 18, and the inner circumference of the dummy pattern area 58 is indicated by a one-dot chain line) is set so as to surround the measurement mark structure 57 with a desired distance set therebetween. The measurement area 56 has a dummy uneven structure 59 that is not the measurement mark structure in the dummy pattern area 58. Note that the position of the measurement area 56 set in the uneven structure area A of the mold 51 is not limited to the position described above, and the position thereof can be appropriately set in consideration of the numbers of the main pattern areas 54 and the non-main pattern areas 55 set in the uneven structure area A, the sizes thereof, and the uneven structure provided in the main pattern area 54. In addition, similarly to the above case, the number of the set measurement areas 56 can also be appropriately set in consideration of the numbers of the main pattern areas 54 and the non-main pattern areas 55 set in the uneven structure area A, the sizes thereof, and the uneven structure provided in the main pattern area 54.

Figure 19:
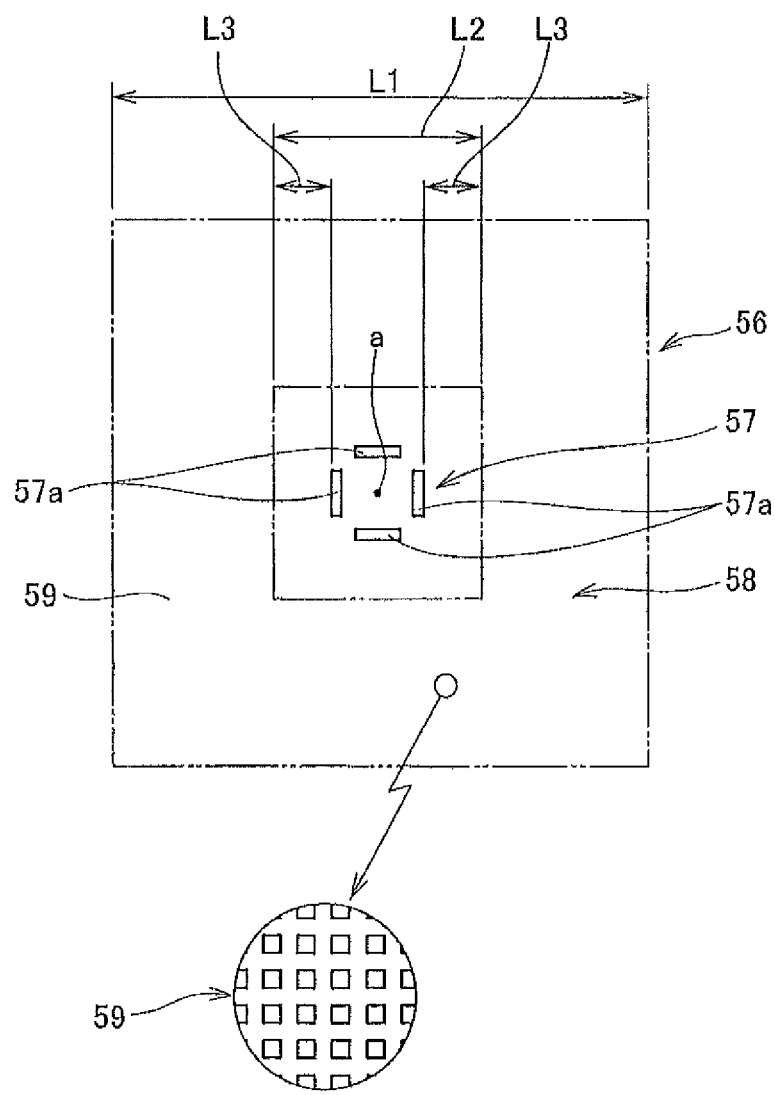
FIG. 19 is an enlarged view of the measurement area shown in FIG. 18.

FIG. 19 is an enlarged view of the measurement area 56 shown in FIG. 18. As shown in FIG. 19, the measurement mark structure 57 is constituted by four depressions 57*a* each having a rectangular plan view shape or four projections 57*a* each having a rectangular plan view shape, and the plan view shape of the measurement mark structure 57 has the rotational symmetry having the four-fold axis a of the constant angle of 90°. The dimensions of the rectangular depression 57*a* or the rectangular projection 57*a* are not less than the resolution of the position detection apparatus used when the measurement mark formed by the measurement mark structure 57 is detected, and can be appropriately set in a range that falls within the field of view of the position detection apparatus. For example, in the case where 30 μm is set as the common field of view, it is possible to set the dimension in the longitudinal direction to 1 to 20 μm and preferably about 5 to 15 μm, and set the dimension in the width direction to 0.1 to 3 μm and preferably about 0.3 to 1 μm. In particular, the dimension of the rectangular depression 57*a* or the rectangular projection 57*a* in the width direction is preferably smaller because the depression or projection 57*a* becomes less likely to be influenced by the deformation at the time of the mold release. However, when the dimension thereof in the width direction is extremely small, the area that can be viewed at the time of the position detection is reduced and the error is increased, and hence it is preferable to set the dimension thereof in the width direction in consideration of this respect. In addition, the depth of the rectangular depression 57*a* or the height of the rectangular projection 57*a* can be appropriately set in consideration of the depth of the depression of the uneven structure of the main pattern area 54 or the height of the projection thereof.

In the dummy pattern area 58 that is set so as to surround the measurement mark structure 57 with the desired distance set therebetween, each of the outer circumference shape (indicated by a two-dot chain line) and the inner circumference shape (indicated by a one-dot chain line) is square, and the plan view shape of the dummy pattern area 58 has also the rotational symmetry having the four-fold axis a of the constant angle of 90°. In the example shown in the drawing, in the dummy uneven structure 59 positioned in the dummy pattern area 58, a plurality of dot-shaped depressions or projections are arranged at a predetermined pitch. In the case where the measurement mark structure 57 is constituted by the four rectangular depressions 57a, the dummy uneven structure 59 is constituted by a plurality of the dot-shaped depressions and, in the case where the measurement mark structure 57 is constituted by the four rectangular projections 57a, the dummy uneven structure 59 is constituted by a plurality of the dot-shaped projections. Note that, in FIG. 19, part of the dummy uneven structure 59 positioned in the dummy pattern area 58 is extracted and enlarged.

The dummy uneven structure 59 achieves the effect of preventing the measurement mark formed by the measurement mark structure 57 from being deformed to be thicker, thinner, or bent in the release of the molded resin from the mold. The outer dimension L of the measurement area 56 (the length of the outer circumferential side of the dummy pattern area 58) and the length L2 of the inner circumferential side of the dummy pattern area 58 can be set such that the dummy uneven structure 59 exerts such an effect, and the presence width of the dummy uneven structure 59 that exerts the effect is preferably not less than 10 μm. On the other hand, as described above, from the viewpoint of detecting the measurement mark, the outer dimension of the dummy pattern area 58 in which the dummy uneven structure 59 is present is limited. Accordingly, for example, in the case where 30 μm is set as the common field of view of the position detection apparatus, the outer dimension L1 can be appropriately set in a range of about 27 to 100 μm. When the outer dimension L1 is less than 27 μm, the area that can be viewed at the time of the position detection is reduced and the error is increased or the effect of the dummy uneven structure 59 becomes insufficient. The upper limit of the outer dimension L1 is not particularly limited but, in order to prevent the influence such as the reduction in the area of the main pattern area caused by the enlargement of the measurement area 56, the upper limit of the outer dimension L1 of not more than 100 μm is appropriate. In addition, the length L2 of the inner circumferential side of the dummy pattern area 58 can be set to, e.g., about 7 to 80 μm. The area that can be viewed at the time of the position detection is reduced and the error is increased when the length L2 of the inner circumferential side is less than 7 μm, and the effect of the dummy uneven structure 59 becomes insufficient when the length L2 exceeds 80 μm. Further, the distance L3 between the inner circumferential side of the dummy pattern area 58 and the measurement mark structure 57 can be appropriately set in a range of not less than 2 μm. When the distance L3 is less than 2 μm, there is a possibility that the position detection apparatus cannot accurately capture the area to be viewed. The upper limit of the distance L3 can be appropriately set in accordance with the dimensions of the measurement mark structure 57 and the length L2 of the inner circumferential side. Note that, in the example shown in FIG. 19, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide with each other, the distance L3 between the inner circumferential side of the dummy pattern area 58 and the measurement mark structure 57 is not constant, and has the maximum value and the minimum value. The minimum value of the distance L3 can be set in a range that allows the position detection apparatus to accurately capture the area to be viewed, e.g., set to not less than 2 μm mentioned above.

In addition, the inner diameter of the dot-shaped depression constituting the dummy uneven structure 59 or the diameter of the projection, and the arrangement pitch of the dot shape can be set so as to be able to prevent the deformation of the pattern structure formed by the measurement mark structure 57. For example, the inner diameter of the dot-shaped depression or the outer diameter of the projection can be appropriately set in a range of about 0.05 to 1 μm and the arrangement pitch of the dot-shaped depression or projection can be appropriately set in a range of about 0.1 to 2 μm, and these dimensions may be less than the resolution of the position detection apparatus that detects the measurement mark formed by the measurement mark structure 57. The plan view shape of the dot-shaped depression or projection is not particularly limited, and can be appropriately set so as to have a square shape, a circular shape, or a square shape with four rounded corners.

As the material of the base 52 of the imprint mold 51, in the case where the molded resin used in the imprint is a photo-curable resin, it is possible to use a material that transmits irradiation light for curing the resin, and, in addition to glass materials such as quartz glass, silicate glass, calcium fluoride, magnesium fluoride, and acrylic glass, it is possible to use, e.g., sapphire, gallium nitride, resins such as polycarbonate, polystyrene, acrylic, and polypropylene, and any laminated material of these. In the case where the molded resin to be used is not the photo-curable resin or in the case where light for curing the molded resin can be emitted from the side of the transfer substrate, the mold 51 may not have light transmissivity and, other than the above materials, it is possible to use, e.g., silicon, metals such as nickel, titanium, and aluminum, alloys, oxides, and nitrides of these, and any laminated material of these.

In addition, in order to facilitate the separation of the mold from the molded resin, the mold release agent layer may be provided on the surface of the uneven structure area A of the mold 51.

The thickness of the base 52 of the mold 51 can be set in consideration of the shape, the strength of the material, and the workability of the uneven structure provided on the surface 52a, and the thickness thereof can be appropriately set in a range of, e.g., about 300 μm to 10 mm. Note that, in the base 52, the surface of the uneven structure area A may have a projection structure having two or more projections with respect to the even structure area B around the uneven structure area A.

Figure 20:
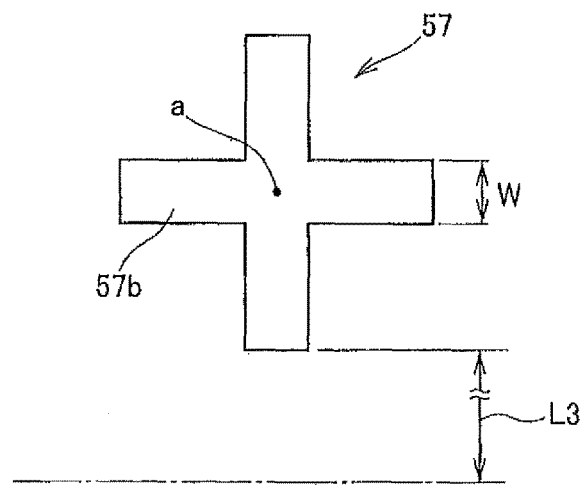
FIG. 20 is a plan view showing another example of the measurement mark structure.

FIG. 20 is a plan view showing another example of the measurement mark structure 57. The measurement mark structure 57 shown in FIG. 20 is constituted by one depression 57b having a cross-shaped plan view shape or one projection having a cross-shaped plan view shape. The plan view shape of the measurement mark structure 57 has the rotational symmetry having the four-fold axis a of the constant angle of 90°. In addition, as shown in the drawing, the distance L3 between the inner circumferential side of the dummy pattern area 58 and the measurement mark structure 57 can be made equal to the distance from each end side of the cross shape to the closest inner circumferential side of the dummy pattern area 58. The dimensions of the cross-shaped depression 57b or the cross-shaped projection 57b can be appropriately set in accordance with the dimensions of the measurement mark structure 57 shown in FIG. 19 described above. That is, the dimensions of the cross-shaped depression 57b or the cross-shaped projection 57b are not less than the resolution of the position detection apparatus used when the measurement mark formed by the measurement mark structure 57 is detected, can be appropriately set in a range that falls within the field of view of the position detection apparatus, and a width W may be, e.g., about 0.1 to 5 µm. In addition, the depth of the cross-shaped depression 57b or the height of the cross-shaped projection 57b can be appropriately set in consideration of the depth of the depression of the uneven structure of the main pattern area 54 or the height of the projection thereof.

Figure 21:
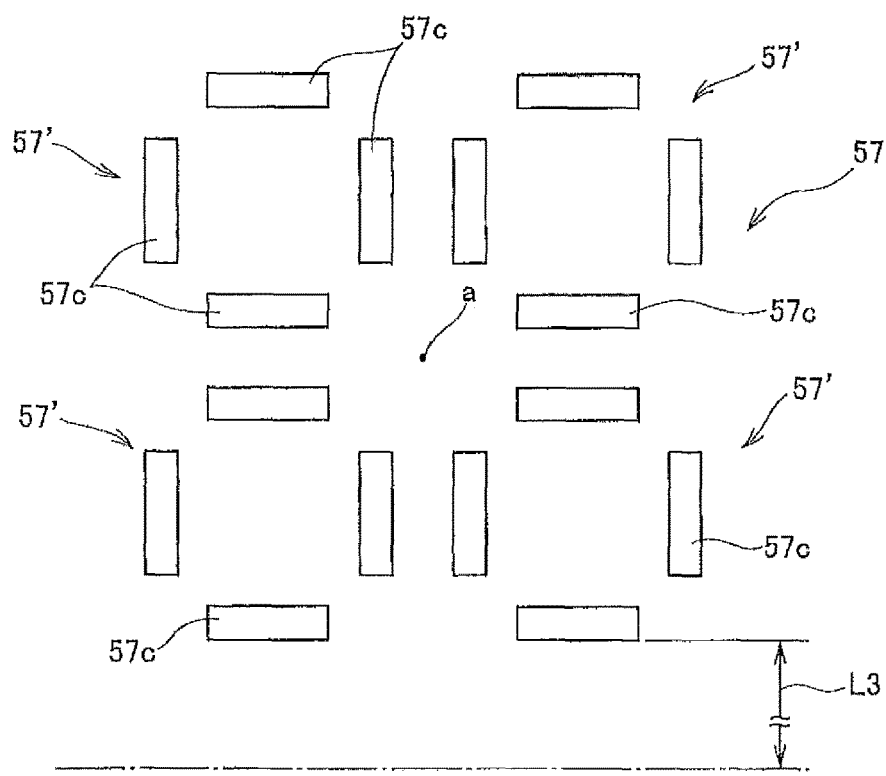
FIG. 21 is a plan view showing another example of the measurement mark structure.

FIG. 21 is a plan view showing another example of the measurement mark structure 57. In the measurement mark structure 57 shown in FIG. 21, four measurement mark structures 57' each in which four depressions 57c each having a rectangular plan view shape or four projections 57c each having a rectangular plan view shape are disposed so as to be positioned at four sides of a square are disposed so as to be positioned at four corners of a larger square. The plan view shape of the measurement mark structure 57 also has the rotational symmetry having the four-fold axis a of the constant angle of 90°. In addition, as shown in the drawing, the distance L3 between the inner circumferential side of the dummy pattern area 58 and the measurement mark structure 57 can be made equal to the distance from the outer circumferential side of a square area in which the four measurement mark structures 57' are disposed to the closest inner circumferential side of the dummy pattern area 58. The dimensions of the rectangular depression 57c or the rectangular projection 57c can be appropriately set in a range of not less than the resolution of the position detection apparatus used when the measurement mark formed by the measurement mark structure 57 is detected and, for example, the dimension in the longitudinal direction may be about 2 to 7 µm and the dimension in the width direction may be about 0.1 to 2 µm. In addition, the depth of the rectangular depression 57c or the height of the rectangular projection 57c can be appropriately set in consideration of the depth of the depression of the uneven structure of the main pattern area 54 or the height of the projection thereof.

Figure 22:
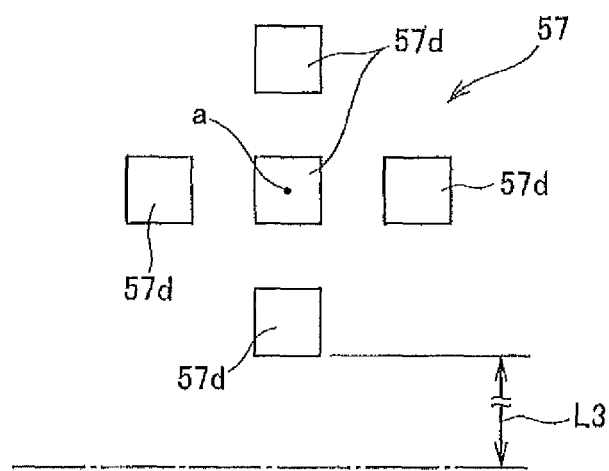
FIG. 22 is a plan view showing another example of the measurement mark structure.

FIG. 22 is a plan view showing another example of the measurement mark structure 57. In the measurement mark structure 57 shown in FIG. 22, five depressions 57d each having a square plan view shape or five projections 57d each having a square plan view shape are disposed so as to form a cross shape. The plan view shape of the measurement mark structure 57 also has the rotational symmetry having the four-fold axis a of the constant angle of 90°. In addition, as shown in the drawing, the distance L3 between the inner circumferential side of the dummy pattern area 58 and the measurement mark structure 57 can be made equal to the distance from each end side of the cross shape constituted by the five square depressions 57d or projections 57d to the closest inner circumferential side of the dummy pattern area 58. The dimensions of the square depression 57d or the square projection 57d can be appropriately set in a range of not less than the resolution of the position detection apparatus used when the measurement mark formed by the measurement mark structure 57 is detected and, for example, the length of one side may be about 1 to 5 µm. In addition, the depth of the square depression 57d or the height of the square projection 57d can be appropriately set in consideration of the depth of the depression of the uneven structure of the main pattern area 54 or the height of the projection thereof.

Note that the plan view shape of the depression or the projection constituting the measurement mark structure 57 is not limited to the rectangular shape or the square shape.

Figure 23:
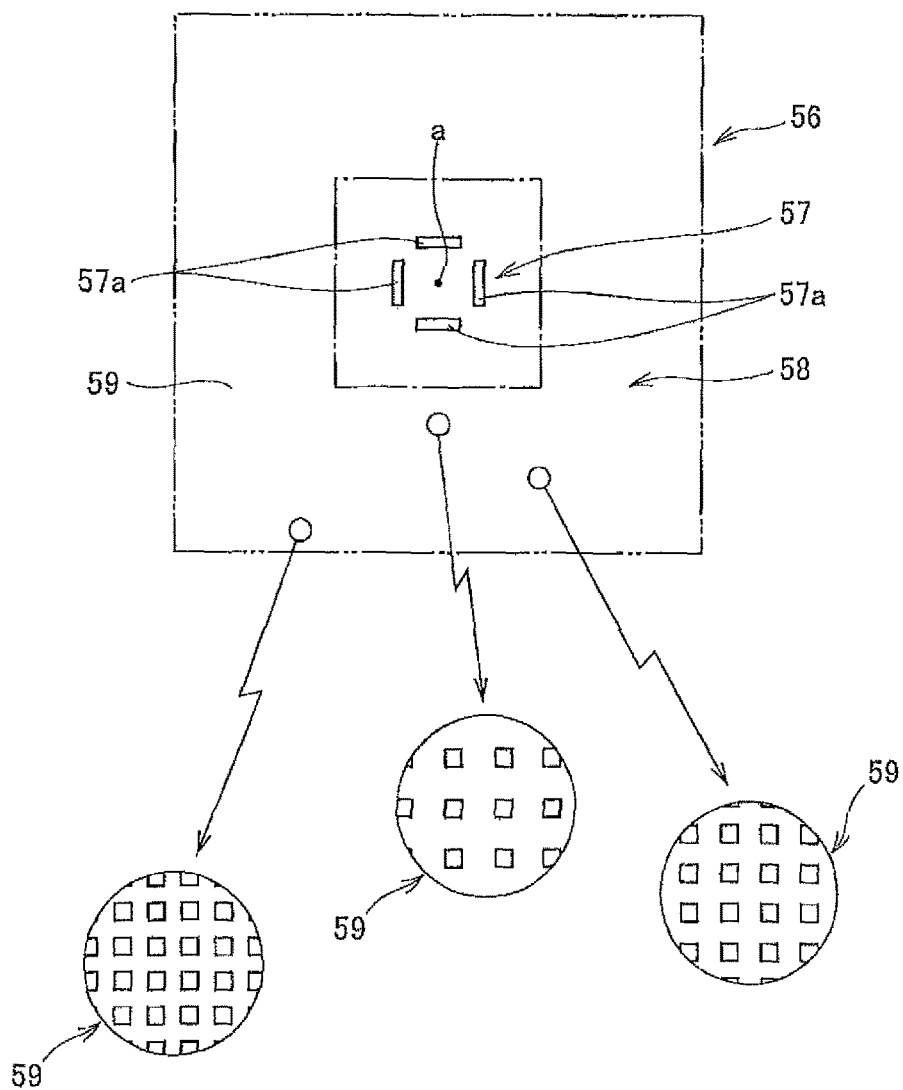
FIG. 23 is a plan view showing another example of a dummy uneven structure.

FIG. 23 is a plan view showing another example of the dummy uneven structure 59. In the dummy uneven structure 59 shown in FIG. 23, a plurality of dot-shaped depressions or projections are arranged such that the density thereof is reduced from the outer circumferential side of the dummy pattern area 58 toward the inner circumferential side thereof to form density gradation. The arrangement pitch of the dot shape in this case can be appropriately set in a range of, e.g., about 0.1 to 2 µm so as to form the density gradation. The density gradation may change continuously or stepwise. The plan view shape of the dummy uneven structure 59 in which the dot shapes are arranged so as to form the density gradation has the rotational symmetry having the four-fold axis a of the constant angle of 90°. Note that, in FIG. 23, part of the dummy uneven structure 59 positioned in the dummy pattern area 58 is extracted and enlarged.

Herein, the density in the dummy uneven structure 59 means the size of the surface area per unit area of the dummy pattern area 58, and a portion in which the surface area per unit area is relatively small is assumed to be a sparse portion and a portion in which the surface area per unit area is relatively large is assumed to be a dense portion.

In the example shown in FIG. 23, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide each other, the distance L3 between the inner circumferential side of the dummy pattern area 58 and the measurement mark structure 57 (see FIG. 19) is not constant, and has the maximum value and the minimum value. The minimum value of the distance L3 can be set in a range that allows the position detection apparatus to accurately capture the area to be viewed, e.g., set to not less than 2 µm.

Note that, in the example shown in FIG. 23, the arrangement density of the dot-shaped depressions or projections having the same size varies and the density gradation is thereby formed, but the density gradation may have other modes. For example, in the sparse portion (the portion in which the surface area per unit area is relatively small), the dot-shaped depression or projection may be large and the arrangement pitch may be large and, in the dense portion (the portion in which the surface area per unit area is relatively large), the dot-shaped depression or projection may be small and the arrangement pitch may be small.

Figure 24:
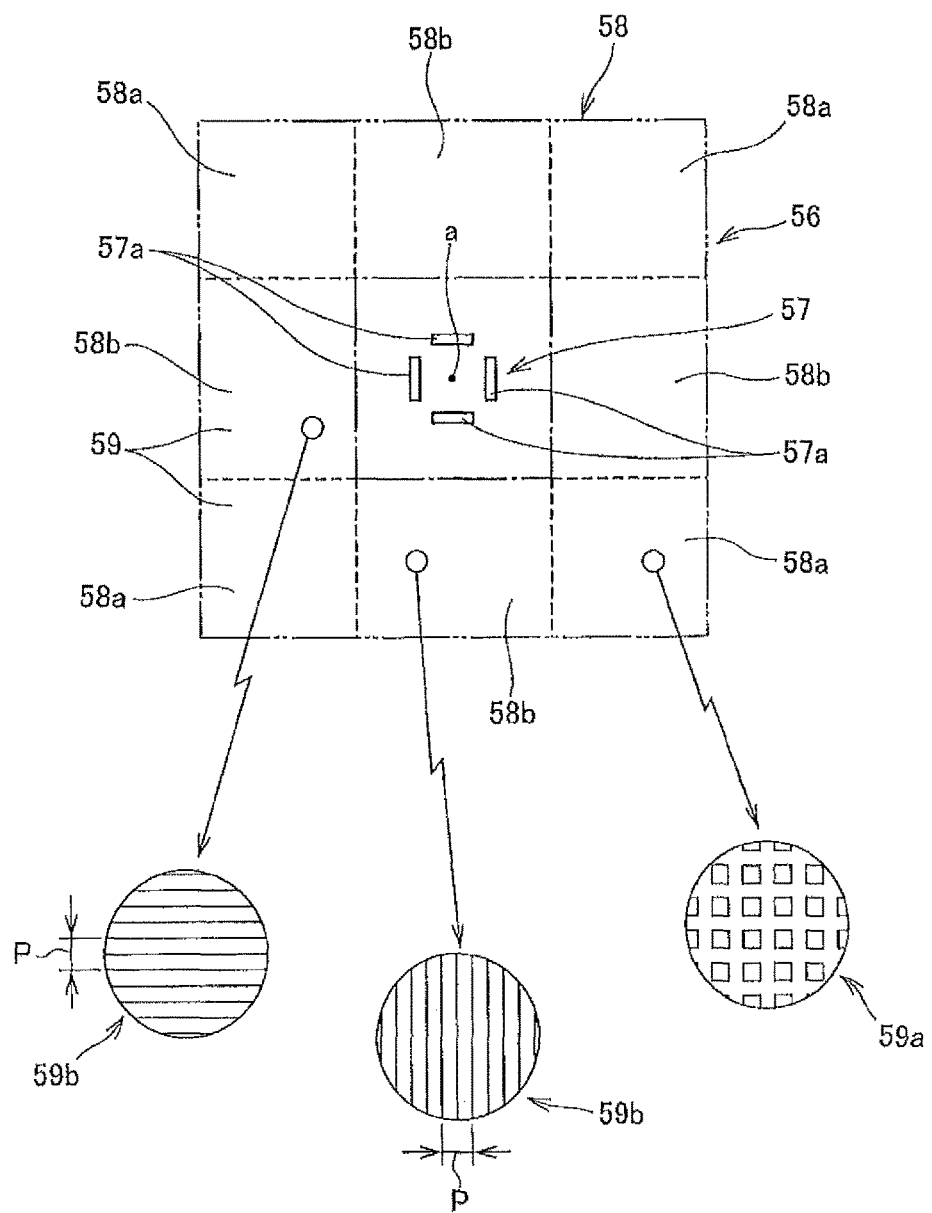
FIG. 24 is a plan view showing another example of the dummy uneven structure.

FIG. 24 is a plan view showing another example of the dummy uneven structure 59. In the example shown in FIG. 24, the dummy pattern area 58 is divided into areas 58a that are positioned at four corners of the measurement area 56 having a square outline and the other areas 58b. Note that the boundary between the area 58a and the area 58b is indicated by a chain line. The dummy uneven structure 59 is constituted by a dummy uneven structure 59a that is positioned in the area 58a and in which a plurality of dot-shaped depressions or projections are arranged at a predetermined pitch and a dummy uneven structure 59b that is positioned in the area 58b and has depressions or projections in the line/space shape. The dummy uneven structure 59a in the dot shape can be made identical with the dummy uneven structure 59 shown in FIG. 19 described above. In addition, the dummy uneven structure 59b in the line/space shape has a shape in which linear depressions or projections each having a predetermined width of, e.g., about 0.05 to 1 µm are periodically arranged at a constant pitch P in a direction orthogonal to a longitudinal direction. In the example shown in the drawing, in each area 58b, the longitudinal direction of the dummy uneven structure 59b is oriented to the measurement mark structure 57. Consequently, the longitudinal direction of the dummy uneven structure 59b positioned in one of the areas 58b matches the longitudinal direction of the dummy uneven structure 59b positioned in the other area 58b that opposes the one area 58b via the measurement mark structure 57. The plan view shape of the dummy uneven structure 59 constituted by the dummy uneven structure 59a and the dummy uneven structure 59b has the rotational symmetry having the four-fold axis a of the constant angle of 90°. Note that, in FIG. 24, part of the dummy uneven structure 59a positioned in the area 58a is extracted and enlarged, and part of the dummy uneven structure 59b positioned in the area 58b is extracted and enlarged.

In addition, in the example shown in FIG. 24, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide with each other, the distance L3 between the inner circumferential side of the dummy pattern area 58 and the measurement mark structure 57 (see FIG. 19) is not constant, and has the maximum value and the minimum value. The minimum value of the distance L3 can be set in a range that allows the position detection apparatus to accurately capture the area to be viewed, e.g., set to not less than 2 μm.

Note that the longitudinal direction of the dummy uneven structure 59b may be a direction orthogonal to that of the example shown in FIG. 24. That is, in each area 58b, the longitudinal direction of the dummy uneven structure 59b may be parallel with the outer circumferential side of the measurement area 56 (the outer circumferential side of the dummy pattern area 58). In this case as well, the plan view shape of the dummy uneven structure 59 has the rotational symmetry having the four-fold axis a of the constant angle of 90°.

Figure 25:
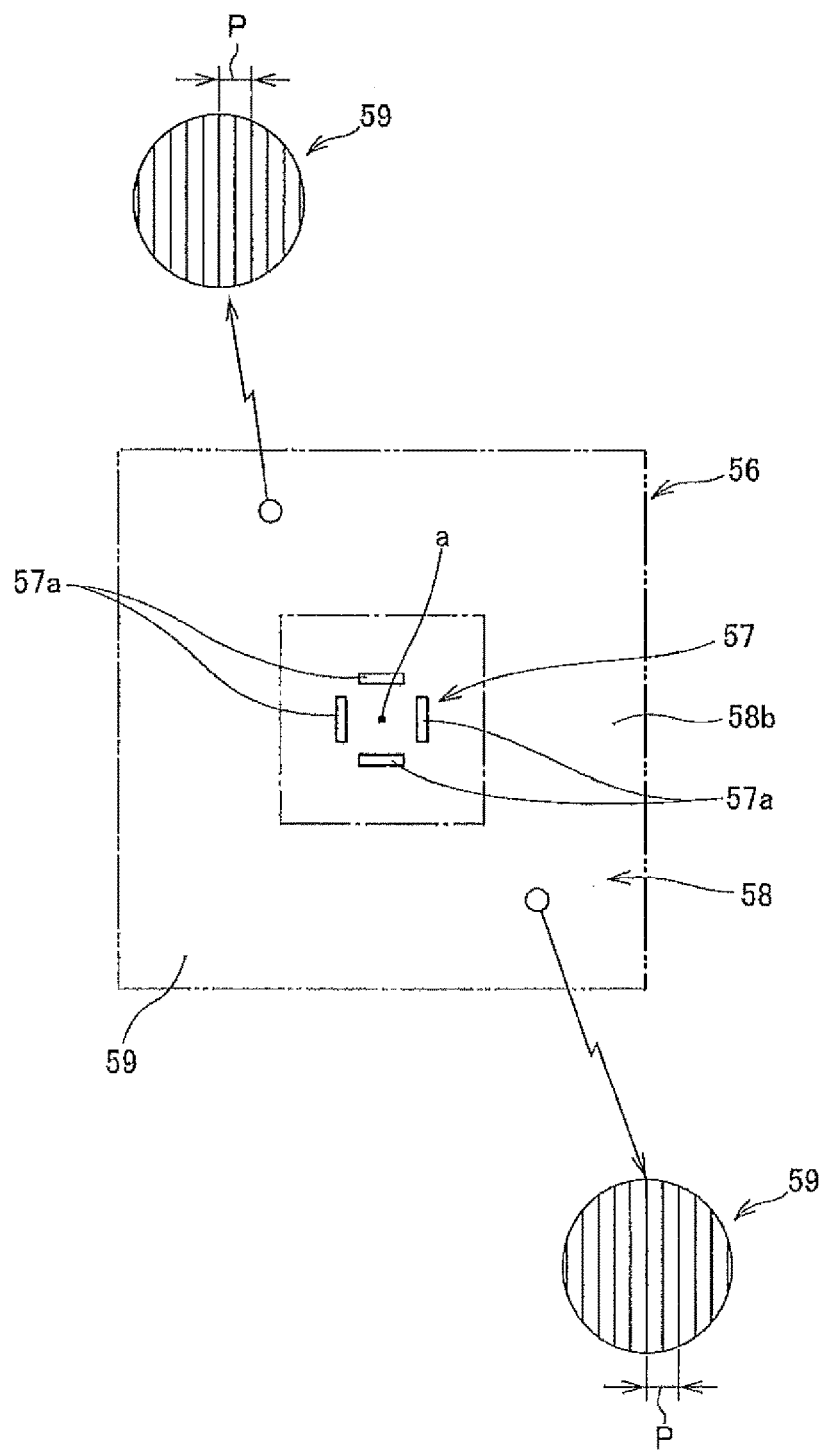
FIG. 25 is a plan view showing another example of the dummy uneven structure.

FIG. 25 is a plan view showing another example of the dummy uneven structure 59. The dummy uneven structure 59 shown in FIG. 25 has depressions or projections in the line/space shape, and the longitudinal direction of the dummy uneven structure 59 matches a specific direction (a direction along a vertical direction in a paper sheet in the example shown in the drawing). The dummy uneven structure 59 in the line/space shape has a shape in which linear depressions or projections each having a predetermined width of, e.g., about 0.05 to 1 μm are periodically arranged at a constant pitch P in a direction orthogonal to a longitudinal direction. The plan view shape of the dummy uneven structure 59 has rotational symmetry having a two-fold axis a of a constant angle of 180°. The dummy uneven structure 59 may have the depressions or projections in the line/space shape that are arranged so as to form the density gradation, and may also have a plurality of dot-shaped depressions or projections in a partial area.

The density in the dummy uneven structure 59 in the line/space shape also means the size of the surface area per unit area of the dummy pattern area 58 similarly to the above case, and a portion in which the surface area per unit area is relatively small is assumed to be a sparse portion and a portion in which the surface area per unit area is relatively large is assumed to be a dense portion.

Note that, in FIG. 25, part of the dummy uneven structure 59 positioned in the dummy pattern area 58 is extracted and enlarged.

In the example shown in FIG. 25, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide with each other, the distance L3 between the inner circumferen-tial side of the dummy pattern area 58 and the measurement mark structure 57 (see FIG. 19) is not constant, and has the maximum value and the minimum value. The minimum value of the distance L3 can be set in a range that allows the position detection apparatus to accurately capture the area to be viewed, e.g., set to not less than 2 μm.

Figure 26:
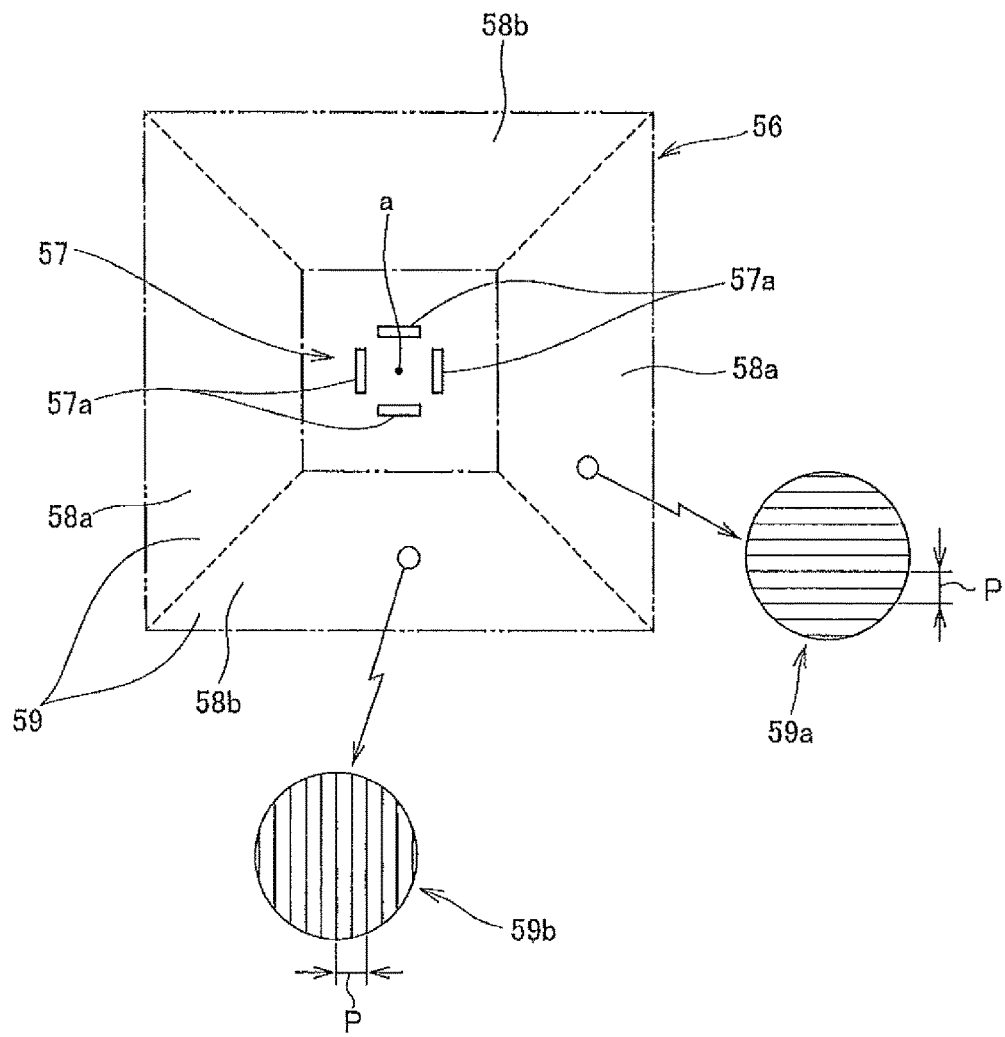
FIG. 26 is a plan view showing another example of the dummy uneven structure.

FIG. 26 is a plan view showing another example of the dummy uneven structure 59. In the example shown in FIG. 26, the dummy pattern area 58 is divided into a pair of areas 58a that oppose each other vie the measurement mark structure 57 and a pair of areas 58b that oppose each other via the measurement mark structure 57 with diagonal lines from four corners of the measurement area 56 having a square outline serving as boundaries. Note that the boundary between the area 58a and the area 58b is indicated by a chain line. The dummy uneven structure 59 is constituted by a dummy uneven structure 59a that is positioned in the area 58a and has depressions or projections in the line/space shape, and a dummy uneven structure 59b that is positioned in the area 58b and has depressions or the projections in the line/space shape. The longitudinal directions of the dummy uneven structures 59a each in the line/space shape positioned in the pair of the areas 58a are identical with each other, and are oriented to the measurement mark structure 57. In addition, the longitudinal directions of the dummy uneven structures 59b each in the line/space shape positioned in the pair of the areas 58b are also identical with each other, and are oriented to the measurement mark structure 57. The longitudinal direction of the dummy uneven structure 59 and the longitudinal direction of the dummy uneven structure 59b are orthogonal to each other.

Each of the dummy uneven structures 59a and 59b each in the line/space shape has a shape in which linear depressions or projections each having a predetermined width of, e.g., about 0.05 to 1 μm are periodically arranged at a constant pitch P in a direction orthogonal to a longitudinal direction. The plan view shape of the dummy uneven structure 59 constituted by the dummy uneven structure 59a and the dummy uneven structure 59b has the rotational symmetry having the four-fold axis a of the constant angle of 90°. Note that, in FIG. 26, part of the dummy uneven structure 59a positioned in the area 58a is extracted and enlarged, and part of the dummy uneven structure 59b positioned in the area 58b is extracted and enlarged.

In addition, in the example shown in FIG. 26, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide with each other, the distance L3 between the inner circumferential side of the dummy pattern area 58 and the measurement mark structure 57 (see FIG. 19) is not constant, and has the maximum value and the minimum value. The minimum value of the distance L3 can be set in a range that allows the position detection apparatus to accurately capture the area to be viewed, e.g., set to not less than 2 μm.

Figure 27:
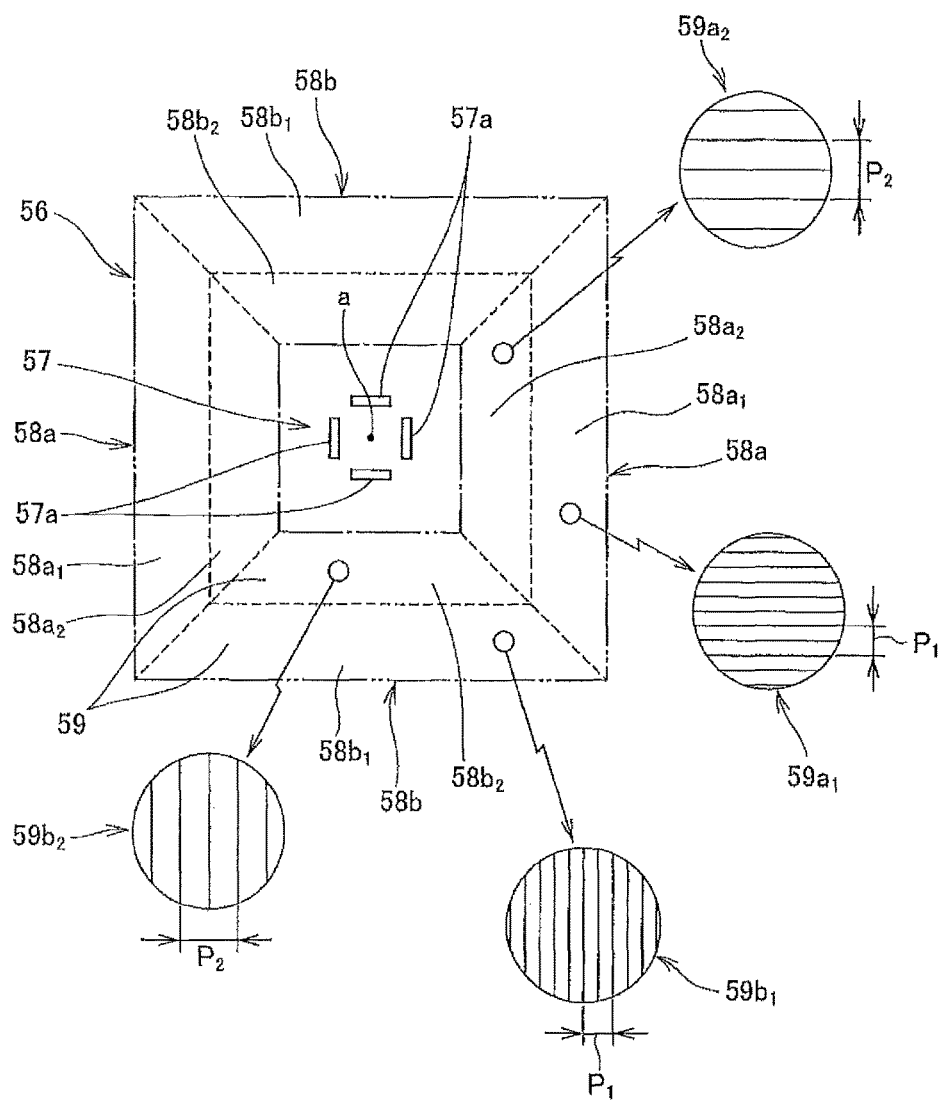
FIG. 27 is a plan view showing another example of the dummy uneven structure.

FIG. 27 is a plan view showing another example of the dummy uneven structure 59. In the example shown in FIG. 27, the dummy pattern area 58 is divided into a pair of areas 58a that oppose each other via the measurement mark structure 57 and a pair of areas 58b that oppose each other via the measurement mark structure 57 with diagonal lines from four corners of the measurement area 56 having the square outline serving as boundaries. Further, the individual areas 58a and 58b are divided into outer areas $58a_1$ and $58b_1$ and inner areas $58a_2$ and $58b_2$ with boundaries parallel with the square outline of the measurement area 56. Note that the boundary between the area 58a and the area 58b, the boundary between the outer area $58a_1$ and the inner area $58a_2$, and the boundary between the outer area $58b_1$ and the inner area $58b_2$ are indicated by chain lines. The dummy uneven structure 59 is constituted by a dummy uneven structure $59a_1$ that is positioned in the outer area $58a_1$ and has depressions or projections in the line/space shape, a dummy uneven area $59a_2$ that is positioned in the inner area $58a_2$ and has depressions or projections in the line/space shape, a dummy uneven structure $59b_1$ that is positioned in the outer area $58b_1$ and has depressions or projections in the line/space shape, and a dummy uneven structure $59b_2$ that is positioned in the inner area $58b_2$ and has depressions or projections in the line/space shape. The longitudinal directions of the dummy uneven structures $59a_1$ and $59a_2$ each in the line/space shape that are positioned in a pair of the areas 58a (the area $58a_1$ and the area $58a_2$) are identical with each other, and are oriented to the measurement mark structure 57. In addition, the longitudinal directions of the dummy uneven structures $59b_1$ and $59b_2$ each in the line/space shape that are positioned in a pair of the areas 58b (the area $58b_1$ and the area $58b_2$) are also identical with each other, and are oriented to the measurement mark structure 57. Consequently, the longitudinal directions of the dummy uneven structures $59a_1$ and $59a_2$ are orthogonal to the longitudinal directions of the dummy uneven structures $59b_1$ and $59b_2$.

Each of the dummy uneven structures $59a_1$, $59a_2$, $59b_1$, and $59b_2$ each in the line/space shape has a shape in which linear depressions or projections each having a predetermined width of, e.g., about 0.05 to 1 µm are periodically arranged at a constant pitch in a direction orthogonal to a longitudinal direction. Further, in the dummy uneven structure 59 in this example, the dummy uneven structures positioned in the outer areas $58a_1$ and $58b_1$ are dense, and the dummy uneven structures positioned in the inner areas $58a_2$ and $58b_2$ are sparse. That is, the pitch of each of the dummy uneven structures $59a_1$ and $59b_1$ positioned in the outer areas $58a_1$ and $58b_1$ is $P_1$, and the pitch of each of the dummy uneven structures $59a_2$ and $59b_2$ positioned in the outer areas $58a_2$ and $58b_2$ is $P_2$ ($P_1$<$P_2$). Consequently, the surface area per unit area of each of the outer areas $58a_1$ and $58b_1$ is larger than the surface area per unit area of each of the inner areas $58a_2$ and $58b_2$.

The plan view shape of the dummy uneven structure 59 constituted by the dummy uneven structures $59a_1$, $59a_2$, $59b_1$, and $59b_2$ has the rotational symmetry having the four-fold axis a of the constant angle of 90°. Note that, in FIG. 27, part of each of the dummy uneven structures $59a_1$ and $59a_2$ positioned in the area $58a_1$ and the area $58a_2$ is extracted and enlarged, and part of each of the dummy uneven structures $59b_1$ and $59b_2$ positioned in the area $58b_1$ and the area $58b_2$ is extracted and enlarged.

In addition, in the example shown in FIG. 27, the four-fold axis a of the plan view shape of the dummy pattern area 58 having the rotational symmetry of the constant angle of 90° coincides with the four-fold axis a of the constant angle of 90° of the measurement mark structure 57, but they may not coincide with each other. In the case where they don't coincide with each other, the distance L3 between the inner circumferential side of the dummy pattern area 58 and the measurement mark structure 57 (see FIG. 19) is not constant, and has the maximum value and the minimum value. The minimum value of the distance L3 can be set in a range that allows the position detection apparatus to accurately capture the area to be viewed, e.g., set to not less than 2 µm.

In the example shown in FIG. 27, the density of the dummy uneven structure 59 on the inner side is different from that on the outer side, but the change of the density may be set more minutely.

The imprint mold of the present invention described above is capable of preventing the deformation occurring at the time of the mold release of the molded resin after being cured and the mold to form the measurement mark with high accuracy and, with this, it becomes possible to accurately detect the magnitude and the direction of the deviation of the pattern in the formation of the pattern structure by using the mold, modification of the design coordinates or the like in the mold design is facilitated, and the control of correction of the pattern accuracy that is performed by giving the desired deformation to the mold at the time of the imprint is facilitated.

The embodiment of the imprint mold described above is only exemplary, and the present invention is not limited to the embodiment. For example, other than the measurement area 56, an area in which the uneven structure or the like for facilitating the separation of the mold from the molded resin and preventing the deformation of the pattern structure formed in the main pattern area 54 is provided may also be set in the non-main pattern area 55.

In the imprint mold of the present invention, the degree of the deformation occurring in the measurement mark at the time of the mold release of the molded resin after being cured and the mold is considered to be influenced not only by the dummy uneven structure positioned in the dummy pattern area but also the orientation of the pattern in the line/space shape in the main patter area having a large area. Consequently, it is preferable to set the configuration of the dummy pattern area and the dummy uneven structure in consideration of the overall orientation of the pattern of the mold.

[Imprint Method]

An imprint method of the present invention includes a resin supply step, a contact step, a curing step, and a mold release step. In addition, after the mold release step, the imprint method includes a detection step of detecting the position of the measurement mark formed together with the pattern structure on an as needed basis.

The imprint method of the present invention will be described with reference to FIGS. 28A to 28D by taking the case where the imprint mold 1 of the present invention described above is used as an example. Note that, in FIGS. 28A to 28D, the uneven structure that the mold 1 includes in the uneven structure area A (the depression in the drawing) is indicated by a chain line for convenience, and the uneven structure positioned in the main pattern area 4 and the measurement mark structure 7 positioned in the measurement area 6 are not distinguished from each other in the uneven structure.

<Resin Supply Step>

Figure 28A:
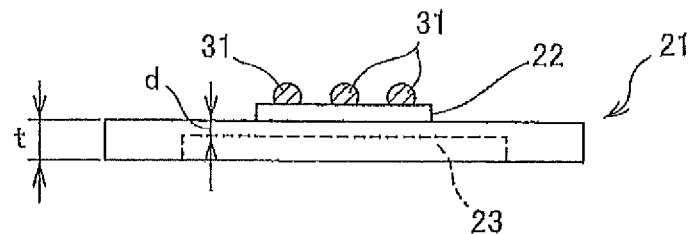
FIGS. 28A to 28D are step diagrams for explaining an embodiment of an imprint method of the present invention.

In the resin supply step, droplets 31 of the molded resin are discharged from an ink jet head (not shown) and supplied to a desired area on a transfer substrate 21 for the imprint (FIG. 28A).

The transfer substrate 21 used in the imprint method of the present invention can be appropriately selected and, for example, glasses such as quartz, soda lime glass, and borosilicate glass, semiconductors such as silicon, gallium arsenide, and gallium nitride, resin substrates of polycarbonate, polypropylene, and polyethylene, metal substrates, or composite material substrates of any combination of these materials may be selected. Alternatively, the transfer substrate 21 may also be, e.g., a substrate formed with a desired pattern structure such as a micro-wiring mounted on a semiconductor, a display, or others and an optical structure such as a photonic crystal structure, an optical guide, and a hologram.

In the example shown in the drawing, the transfer substrate 21 has a mesa structure having a projection structure portion 22, and has a depression 23 on a surface opposite to the mesa structure. Thus, by having the depression 23, it becomes easy to bend the transfer substrate 21, and the release from the mold in the mold release step described later becomes easier. The plan view shape of the depression 23 overlaps the plan view shape of the above projection structure portion 22 and the size thereof allows the plan view shape of the depression 23 to include the plan view shape of the projection structure portion 22, and the center of the plan view shape of the depression 23 preferably coincides with the center of the plan view shape of the projection structure portion 22. In addition, the outline of the plan view shape of the depression 23 may be circular or polygonal, and is not particularly limited. Further, although depending on the area of the plan view shape of the depression 23, a thickness d of the transfer substrate 21 in a portion in which the depression 23 is positioned and the projection structure portion 22 is not present is, for example, preferably not more than half of a thickness t at the end portion of the transfer substrate 21. Note that the shape of the transfer substrate 21 is not limited to the mesa structure, and may also be a shape without the depression 23.

The molded resin may be any resin as long as the resin has fluidity that allows discharge from the ink jet head, and examples thereof include a photo-curable resin and a thermosetting resin. For example, the photo-curable resin may be the one that includes a base resin, an initiator, and a cross-linking agent or contains, on an as needed basis, a mold release agent for preventing adhesion to the mold and an adhesion agent for improving adhesion properties to the transfer substrate 21. The molded resin to be used can be appropriately selected in accordance with the use, required characteristics, and physical properties of the pattern structure manufactured by the imprint method. For example, when the use of the pattern structure is lithography, the molded resin is required to have etching resistance, low viscosity, and a small remaining film thickness and, when the use of the pattern structure is an optical member, the molded resin is required to have a specific refractive index and light transmissivity, and the photo-curable resin can be appropriately selected in response to these requirements. However, in any use, it is required to have characteristics (viscosity and surface tension) that satisfy suitability to the ink jet head to be used. Note that the suitable viscosity of liquid and the surface tension thereof differ depending on the structure and the material of the ink jet head. Accordingly, it is preferable to appropriately adjust the viscosity and the surface tension of the molded resin to be used, or appropriately select the ink jet head suitable for the molded resin to be used.

In addition, the number of the droplets 31 of the molded resin supplied onto the transfer substrate 21 and the distance between adjacent droplets can be appropriately set from the amount of each droplet, the total amount of the required photo-curable resin, wettability of the photo-curable resin to the substrate, and a gap between the mold 1 and the transfer substrate 21 in the contact step as the subsequent step.

<Contact Step>

Figure 28B:
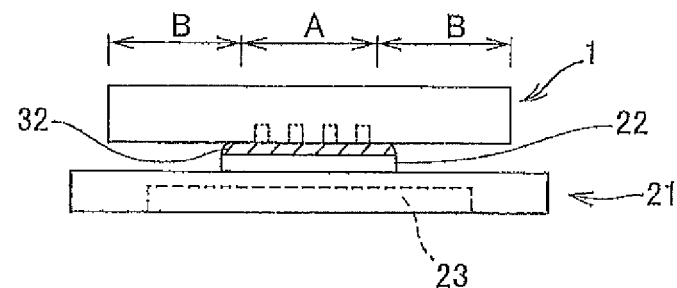

Next, the mold 1 and the transfer substrate 21 are brought close to each other, the droplets 31 of the resin are spread between the mold 1 and the transfer substrate 21, and a photo-curable resin layer 32 is formed (FIG. 28B).

In the example shown in the drawing, the uneven structure area A of the mold 1 is positioned so as to oppose the projection structure portion 22 of the transfer substrate 21 as the mesa structure.

<Curing Step>

Figure 28C:
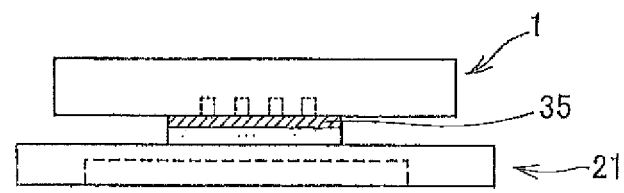

Next, light irradiation is performed from the side of the mold 1, the photo-curable resin layer 32 is thereby cured, and a transfer resin layer 35 to which the uneven structure of the mold 1 is transferred is formed (FIG. 28C). In the curing step, in the case where the transfer substrate 21 is formed of a light-transmitting material, the light irradiation may be performed from the side of the transfer substrate 21, and the light irradiation may also be performed from the sides of both of the transfer substrate 21 and the mold 1.

In the case where the molded resin is the thermosetting resin, the molded resin can be cured by performing heating processing on the molded resin layer 32.

<Mold Release Step>

Figure 28D:
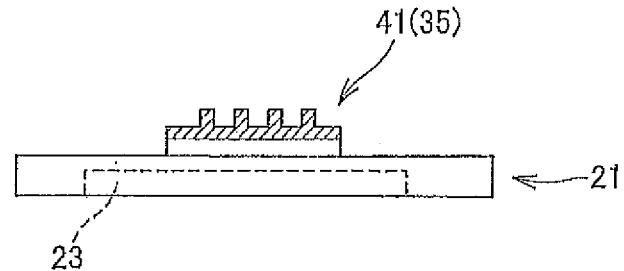

Next, in the mold release step, the transfer resin layer 35 and the mold 1 are separated from each other, and a pattern structure 41, which is the transfer resin layer 35, is positioned on the transfer substrate 21 (FIG. 28D).

<Detection Step>

In the detection step, the position of the measurement mark formed together with the pattern structure is detected on an as needed basis.

Figure 29:
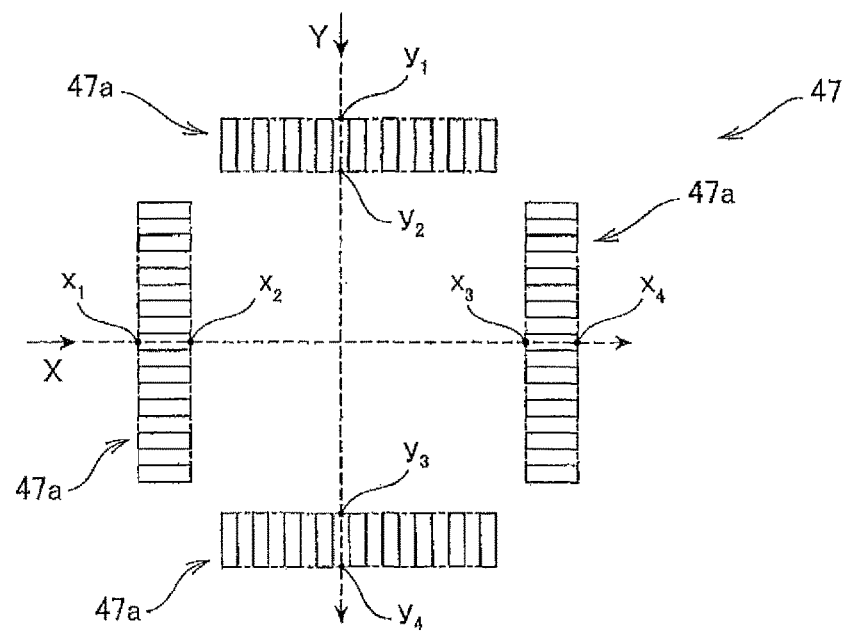
FIG. 29 is a view for explaining detection of a measurement mark formed together with a pattern structure by imprint by using the mold of the present invention.

FIG. 29 is a view for explaining position detection of a measurement mark 47 formed together with the pattern structure by the imprint as described above by using the mold 1 of the present invention shown in FIG. 4. FIG. 29 explains an example in which four measurement marks 47a each in the line/space shape that are formed by the pattern sets 7a each in the line/space shape of the measurement mark structure 7 in FIG. 4. In this example, the position detection apparatus scans the measurement mark 47 from a direction indicated by an arrow X (X direction), whereby positions of an end portion $x_1$, an end portion $x_2$, an end portion $x_3$, and an end portion $x_4$ of two measurement marks 47a each in the line/space shape constituting the measurement mark 47 are detected. In addition, the position detection apparatus scans the measurement mark 47 from a direction indicated by an arrow Y (Y direction), whereby positions of an end portion $y_1$, an end portion $y_2$, an end portion $y_3$, and an end portion $y_4$ of two measurement marks 47a each in the line/space shape constituting the measurement mark 47 are detected. From the detected positions of the end portions of the measurement marks 47a, it is possible to detect the presence or absence and the magnitude of the deviation of the pattern in the portion in which the measurement mark 47 is positioned in the X direction and the Y direction with respect to the design coordinates. In the case where the deviation is present in the pattern, it is possible to accurately detect the magnitude and the direction of the deviation of the pattern in the portion in which the measurement mark 47 is positioned from the magnitude of the deviation in the X direction and the magnitude of the deviation in the Y direction and, by measuring a plurality of the measurement marks 47, it is possible to accurately detect the magnitude and the direction of the deviation of the pattern in the pattern structure formed by using the mold with respect to the design coordinates, an overall standard deviation with respect to the design coordinates, and the degree of enlargement or reduction.

Note that, in the case where the measurement mark 47 is the pattern in the line/space shape formed by the pattern set shown in FIG. 5 or 7, and the line width and the space width are not less than the resolution of the position detection apparatus, data on the positions of the end portions detected in the X direction and the Y direction is increased, and it is possible to improve the measurement accuracy.

Figure 30:
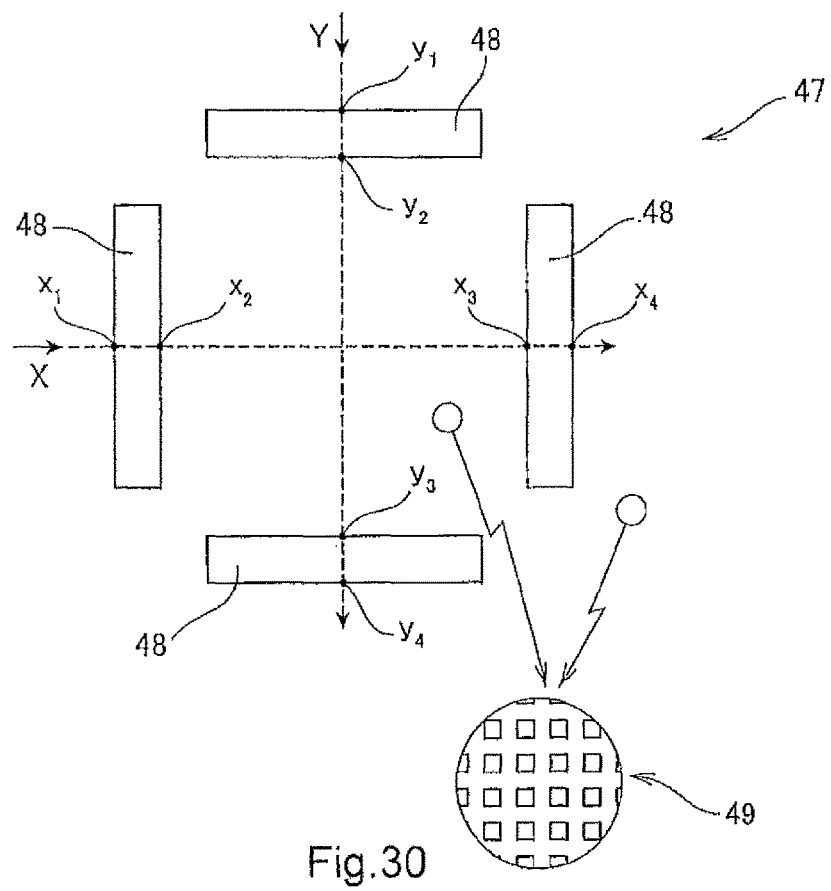
FIG. 30 is a view for explaining the detection of the measurement mark formed together with the pattern structure by the imprint by using the mold of the present invention.

FIG. 30 is a view for explaining the position detection of the measurement mark 47 formed together with the pattern structure by the imprint as described above by using the mold 1 of the present invention shown in FIG. 10. FIG. 30 explains an example in which the measurement mark 47 formed by the measurement mark structure 17 in FIG. 10 is measured. In the measurement mark 47, a pattern set 49 corresponding to the sub-structure 19 of the measurement mark structure 17 is less than the resolution of the position detection apparatus, and the individual projections or depressions are not detected. Accordingly, when the position detection apparatus scans the measurement mark 47 from a direction indicated by an arrow X shown in the drawing (X direction), positions of an end portion $x_1$, an end portion $x_2$, an end portion $x_3$, and an end portion $x_4$ of two flat portions 48 corresponding to the flat portions 18 of the measurement mark structure 17 are detected. In addition, the position detection apparatus scans the measurement mark 47 from a direction indicated by an arrow Y shown in the drawing (Y direction), whereby positions of an end portion $y_1$, an end portion $y_2$, an end portion $y_3$, and an end portion $y_4$ of two flat portions 48 are detected. From the detected positions of the end portions of the flat portions 48 of the measurement mark 47, it is possible to detect the presence or absence and the magnitude of the deviation of the pattern in the portion in which the measurement mark 47 is positioned in the X direction and the Y direction with respect to the design coordinates. In the case where the deviation is present in the pattern, it is possible to accurately detect the magnitude and the direction of the deviation of the pattern in the portion in which the measurement mark 47 is positioned from the magnitude of the deviation in the X direction and the magnitude of the deviation in the Y direction and, by measuring a plurality of the measurement marks 47, it is possible to accurately detect the magnitude and the direction of the deviation of the pattern in the pattern structure formed by using the mold with respect to the design coordinates, the overall standard deviation with respect to the design coordinates, the degree of enlargement or reduction, and other characteristics.

Note that, in the case where the pattern set 49 of the measurement mark 47 has the pattern in the line/space shape formed by the pattern set 19a in the line/space shape of the sub-structure 19 shown in FIGS. 14, 15A, and 15B, and the line width and the space width are not less than the resolution of the position detection apparatus, data on the positions of the end portions detected in the X direction and the Y direction is increased, and it is possible to improve the measurement accuracy.

The imprint method of the present invention described above can be used in the manufacturing of a semiconductor device and the manufacturing of a replica mold using a master mold. By providing a plurality of the measurement mark structures in the master mold in advance, and measuring the measurement marks formed in the replica mold fabricated by using the master mold or the measurement marks formed in the pattern structure fabricated by using the replica mold, it is possible to detect the magnitude and the direction of the deviation with respect to the design coordinates. With this, the modification of the design coordinates or the like in the mold design is facilitated. In addition, the control of correction of the pattern accuracy that is performed by giving the desired deformation to the mold at the time of the imprint is facilitated. Consequently, the imprint method of the present invention is capable of stably fabricating the high-accuracy pattern structure.

The embodiment of the imprint method described above is only exemplary, and the present invention is not limited thereto.

Next, the imprint method of the present invention will be described by using the case where the imprint mold 51 of the present invention described above is used as an example.

In the imprint method that uses the imprint mold 51 as well, it is possible to perform the resin supply step, the contact step, the curing step, and the mold release step similarly to the imprint method that uses the imprint mold 1 described above. Accordingly, the description of the resin supply step, the contact step, the curing step, and the mold release step in the imprint method that uses the imprint mold 51 will be omitted.

Hereinbelow, the detection step in the imprint method that uses the imprint mold 51 will be described.

<Detection Step>

In the detection step, the position of the measurement mark formed together with the pattern structure is detected on an as needed basis.

Figure 31:
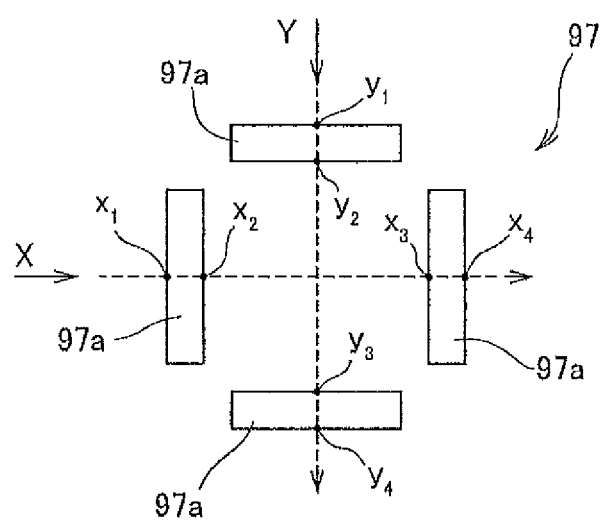
FIG. 31 is a view for explaining the detection of the measurement mark formed together with the pattern structure by the imprint by using the mold of the present invention.

FIG. 31 is a view for explaining the position detection of a measurement mark 97 formed together with the pattern structure by the imprint as described above by using the mold 51 of the present invention shown in FIG. 19. FIG. 31 explains an example in which projections 97a or depressions 97a of the measurement mark 97 formed by the depressions 57a or the projections 57a of the measurement mark structure 57 in FIG. 19 are measured. In this example, the position detection apparatus scans the measurement mark 97 from a direction indicated by an arrow X (X direction), whereby positions of an end portion $x_1$, an end portion $x_2$, an end portion $x_3$, and an end portion $x_4$ of the projections 97a or depressions 97a each having a rectangular plan view shape that constitute the measurement mark 97 are detected. In addition, the position detection apparatus scans the measurement mark 97 from a direction indicated by an arrow Y (Y direction), whereby positions of an end portion $y_1$, an end portion $y_2$, an end portion $y_3$, and an end portion $y_4$ of the projections 97a or the depressions 97a each having the rectangular plan view shape that constitute the measurement mark 97 are detected. From the detected positions of the end portions of the measurement mark 97, it is possible to detect the presence or absence and the magnitude of the deviation of the pattern in the portion in which the measurement mark 97 is positioned in the X direction and the Y direction with respect to the design coordinates. In the case where the deviation is present in the pattern, it is possible to accurately detect the magnitude and the direction of the deviation of the pattern in the portion in which the measurement mark 97 is positioned from the magnitude of the deviation in the X direction and the magnitude of the deviation in the Y direction and, by measuring a plurality of the measurement marks 97, it is possible to accurately detect the magnitude and the direction of the deviation of the pattern in the pattern structure formed by using the mold with respect to the design coordinates, the overall standard deviation with respect to the design coordinates, and the degree of enlargement or reduction.

The imprint method of the present invention described above can be used in the manufacturing of the semiconductor device and the manufacturing of the replica mold using the master mold. By providing a plurality of the measurement mark structures in the master mold in advance and measuring the measurement marks formed in the replica mold fabricated by using the master mold or the measurement marks formed in the pattern structure fabricated by using the replica mold, it is possible to detect the magnitude and the direction of the deviation with respect to the design coordinates. With this, the modification of the design coordinates or the like in the mold design is facilitated. In addition, the control of correction of the pattern accuracy that is performed by giving the desired deformation to the mold at the time of the imprint is facilitated. Consequently, the imprint method of the present invention is capable of stably fabricating the high-accuracy pattern structure.

The embodiment of the imprint method described above is only exemplary, and the present invention is not limited thereto.

EXAMPLES

Next, the present invention will be described in greater details by using Examples.

Example 1

<Fabrication of Mold>

A quartz glass substrate (152 mm×152 mm, thickness 6.35 mm) was prepared as a flat plate-like base, and an uneven structure area of 25 mm×30 mm was set at the center of a surface of the base.

Next, a chromium thin film was formed on the surface of the base by a sputtering method. Then, an electron beam positive resist was applied onto the chromium thin film by a spin coating method. A desired resist pattern was formed on a hard mask material layer in the uneven structure area by performing electron beam drawing based on design coordinates on the application film and performing development. In the design coordinates, rectangular main pattern areas (1530 μm×1320 μm) were set so as to form a grid, and non-main pattern areas were set so as to form a lattice in gap portions of the individual main pattern areas (see FIG. 2). Square measurement areas (100 μm×100 μm) were set at 352 positions in the intersection portions of the non-main pattern areas. Further, in each measurement area, four drawing areas each having the length of each line of 1 μn and the line/space of 0.2 μm/0.2 μm were set at the center of the measurement area so as to be positioned at individual sides of a 12-μm square (the arrangement axis of the line/space was positioned on the side of the square). Note that the drawing area in the line/space shape (line: 0.12 μm, space: 0.12 μm) disposed such that the longitudinal direction of each line matched the Y direction (see FIG. 4) was set in the main pattern area set so as to form the grid.

Next, the chromium thin film was etched via the resist pattern, and a hard mask was formed.

Then, etching was performed on the base (quartz glass) via the hard mask formed in the above manner, and an imprint master mold was thereby fabricated.

The master mold fabricated in this manner included a measurement mark structure in which four line/space (0.2 m/0.2 μm) pattern sets each having an outline in a rectangular plan view shape (1 μm×8 μm) were formed so as to be positioned at the individual sides of a 12-μm square positioned at the center of each measurement area. The measurement mark structure had rotational symmetry having a four-fold axis at a constant angle of 90° (see FIG. 4). Note that the uneven structure of the master mold was observed using a scanning electron microscope and the dimensions thereof were measured.

<Pattern Formation>

As the transfer substrate for the replica mold, a mesa-structure quartz glass substrate (152 mm×152 mm, thickness 6.35 mm) that had a projection structure portion having the size of 25 mm×30 mm and the height of 30 μm at the center was prepared. Droplets of a photo-curable molded resin were supplied to the projection structure portion of the transfer substrate by using an ink jet apparatus.

The transfer substrate to which the molded resin was supplied in the above manner and the master mold were brought close to each other, the droplets were spread between the master mold and the transfer substrate, and a photo-curable resin layer was formed.

Next, parallel light (ultraviolet having a peak wavelength of 365 nm) was emitted to the side of the master mold from an illumination optical system of the imprint apparatus under a condition of 1000 mJ/cm$^2$. With this, light irradiation was performed from the side of the master mold, the photo-curable resin layer was thereby cured, and a transfer resin layer to which the uneven structure of the master mold was transferred was formed.

Next, the transfer resin layer and the master mold were separated from each other, and the pattern structure, which is the transfer resin layer, was positioned on the transfer substrate.

<Evaluation of Pattern Structure>

With regard to the measurement mark structure of the master mold and the measurement mark formed together with the pattern structure positioned on the transfer substrate for the replica mold, the positions of the end portions in the X direction and the Y direction shown in FIG. 29 were detected in each measurement area. Further, with regard to the measurement mark positioned on the transfer substrate for the replica mold, the width of the measurement mark in each measurement area was measured. Subsequently, a difference in displacement amount between the position of the measurement mark on the transfer substrate for the replica mold and the position of the measurement mark structure of the master mold was determined for each of the X direction and the Y direction, and a standard deviation σ thereof was calculated. In addition, the standard deviation a of the width of the measurement mark in each of the X direction and the Y direction was calculated. As a result, as shown in Table 1 shown below, 3σ of the displacement amount of the measurement mark position in the X direction was 2.13 nm, and 3σ of the displacement amount of the measurement mark position in the Y direction was 3.48 nm. It is considered that the difference in 3σ of the displacement amount between the X direction and the Y direction was caused due to an influence of the direction of the line/space of the pattern in the main pattern area set so as to form the grid. In addition, 3σ of the width of the measurement mark in the X direction was 6.3 nm and 3σ of the width of the measurement mark in the Y direction was 6.5 nm, and it was determined that the deformation of the measurement mark was sufficiently prevented. Note that the detection of the position of the end portion of the measurement mark was performed by using IPRO Series manufactured by KLA-tencor Corporation.

Example 2

<Fabrication of Mold>

Four non-drawing areas each having a rectangular plan view shape (1 μm×8 μm) were set so as to be positioned at individual sides of a 12-μm square in each measurement area of the design coordinates of the electron beam drawing. In addition, along long sides of the four rectangular non-drawing areas, pixel areas in the line/space shape (line: 0.2 µm, space: 0.2 µm) that were disposed such that the longitudinal direction of each line was orthogonal to the long side, and had the length of each line of 1 µm were set. Further, a drawing area in the line/space shape (line: 0.2 µm, space: 0.2 µm) that was disposed such that the longitudinal direction of each line matched the Y direction (see FIG. 12) was set in the measurement area other than the pixel area and the non-drawing areas described above. The master mold was fabricated in the same manner as in Example 1 except that each measurement area was set in the above manner.

The master mold included, in each measurement area, the measurement mark structure constituted by four flat portions each having the outline in the rectangular plan view shape (1 µm×8 µm), a sub-structure (see FIG. 12) as a pattern set a in the line/space shape (line: 0.2 µm, space: 0.2 µm) that was disposed along the long side of the flat portion and had the length of each line of 1 µm, and a sub-structure as a pattern set b in the line/space shape (line: 0.2 µm, space: 0.2 µm) that was disposed such that the longitudinal direction of each line matched the Y direction (see FIG. 30) in the measurement area other than the flat portion and the pattern set a described above. That is, in the measurement mark structure in the master mold, in the example shown in FIG. 12, the pattern set 19b had the line/space shape in which the longitudinal direction of the line matched the arrow Y direction instead of the dot shape. Consequently, the measurement mark structure didn't have the rotational symmetry having the center of the measurement area as the four-fold axis at the constant angle of 90°.

<Pattern Formation>

By using the master mold fabricated in this manner, the pattern structure for the replica mold was formed on the transfer substrate in the same manner as in Example 1.

<Evaluation of Pattern Structure>

With regard to the measurement mark structure of the master mold and the measurement mark formed together with the pattern structure positioned on the transfer substrate for the replica mold, the positions of the end portions of the flat portions in the X direction and the Y direction shown in FIG. 30 were detected in each measurement area. Further, with regard to the measurement mark positioned on the transfer substrate for the replica mold, the width of the flat portion in the measurement mark of each measurement area was measured. A difference in displacement amount between the position of the measurement mark on the transfer substrate for the replica mold and the position of the measurement mark structure of the master mold was determined for each of the X direction ad the Y direction, and the standard deviation a thereof was calculated. In addition, the standard deviation a of the width of the measurement mark in each of the X direction and the Y direction was calculated. As a result, as shown in Table 1 shown below, 3σ of the displacement amount of the measurement mark position in the X direction was 2.1 nm, and 3σ of the displacement amount of the measurement mark position in the Y direction was 3.33 nm. It is considered that the difference in 3σ of the displacement amount between the X direction and the Y direction was caused due to the influence of the direction of the line/space of the pattern in the main pattern area set so as to form the grid and the influence of the direction of the line/space of the pattern set b in the measurement area. In addition, 3σ of the width of the measurement mark in the X direction was 5.7 nm and 3σ of the width of the measurement mark in the Y direction was 5.9 nm, and it was determined that the deformation of the measurement mark was sufficiently prevented. Note that, in the detection of the position of the end portion of the measurement mark, the same apparatus as that in Example 1 was used.

Comparative Example 1

<Fabrication of Mold>

The master mold was fabricated in the same manner as in Example 1 except that four drawing areas each having a rectangular plan view shape (1 µm×8 µm) were set so as to be positioned at individual sides of a 12-µm square in each measurement area of the design coordinates of the electron beam drawing.

The master mold included the measurement mark structure in which four depressions each having the rectangular plan view shape (1 µm×8 µm) were formed so as to be positioned at individual sides of a 12-µm square in each measurement area. The measurement mark structure had the rotational symmetry having the center of the measurement area as the four-fold axis at the constant angle of 90°.

<Pattern Formation>

By using the master mold fabricated in this manner, the pattern structure was formed on the transfer substrate in the same manner as in Example 1.

<Evaluation of Pattern Structure>

With regard to the measurement mark structure of the master mold and the measurement mark formed together with the pattern structure positioned on the transfer substrate for the replica mold, the measurement was performed in the same manner as in Example 1, a difference in displacement amount between the position of the measurement mark on the transfer substrate for the replica mold and the position of the measurement mark structure of the master mold was determined for each of the X direction and the Y direction, and the standard deviation σ thereof was calculated. In addition, the standard deviation a of the width of the measurement mark in each of the X direction and the Y direction was calculated. As a result, as shown in Table 1 shown below, 3σ of the displacement amount of the measurement mark position in the X direction was 2.27 nm, and 3σ of the displacement amount of the measurement mark position in the Y direction was 4.15 nm. It is considered that the difference in 3σ of the displacement amount between the X direction and the Y direction was caused due to the influence of the direction of the line/space of the pattern in the main pattern area set so as to form the grid. In addition, 3σ of the width of the measurement mark in the X direction was 6.5 nm and 3σ of the width of the measurement mark in the Y direction was 6.7 nm, and it was determined that the deformation of the measurement mark was large as compared with Example 1 and Example 2.

TABLE 1

| MEASUREMENT ITEM | | EXAMPLE 1 | EXAMPLE 2 | COMPARATIVE EXAMPLE 1 |
|---|---|---|---|---|
| 3σ OF DISPLACEMENT AMOUNT OF MEASUREMENT MARK POSITION (nm) | X DIRECTION | 2.13 | 2.11 | 2.27 |
| | Y DIRECTION | 3.48 | 3.33 | 4.15 |

TABLE 1-continued

| MEASUREMENT ITEM | | EXAMPLE 1 | EXAMPLE 2 | COMPARATIVE EXAMPLE 1 |
|---|---|---|---|---|
| 3σ OF WIDTH OF MEASUREMENT MARK (nm) | X DIRECTION | 6.3 | 5.7 | 6.5 |
| | Y DIRECTION | 6.5 | 5.9 | 6.7 |

Example 3

<Fabrication of Mold>

As a flat plate-like base, a quartz glass substrate (152 mm×152 mm, thickness 6.35 mm) was prepared, and an uneven structure area of 25 mm×30 mm was set at the center of a surface of the base.

Next, a chromium thin film was formed on the surface of the base by the sputtering method. Then, an electron beam-sensitive positive resist was applied onto the chromium thin film by the spin coating method. A desired resist pattern was formed on a hard mask material layer in the uneven structure area by performing electron beam drawing based on design coordinates on the application film and performing development. In the design coordinates, rectangular main pattern areas (1530 µm×1320 µm) were set so as to form a grid, and non-main pattern areas were set so as to form a lattice in gap portions of the individual main pattern areas. Square measurement areas (100 µm×100 µm) were set at 352 positions in the intersection portions of the non-main pattern areas (see FIG. 17). Further, four drawing areas each having a rectangular plan view shape (1 µm×8 µm) were set so as to be positioned at individual sides of a 12-µm square in a square (60 µm×60 µm) area at the center of each measurement area, an area other than the square area at the center was used as a dummy pattern area, and a drawing area in the dot shape (1 µm×1 µm) was set with a pitch of 1.5 µm.

Then, a hard mask was formed by etching the chromium thin film via the resist pattern.

Next, etching was performed on the base (quartz glass) via the hard mask formed in the above manner, and the imprint master mold was thereby fabricated.

In the uneven structure area of the master mold fabricated in this manner, four projections each having a rectangular plan view shape (1 µm×8 µm) were formed so as to be positioned at individual sides of a 12-µm square in a square (60 µm×60 µm) area at the center in each measurement area and the measurement mark structure was thereby constituted, and the dummy uneven structure in which projections each having the outer diameter of 1 µm were formed at a pitch of 1.5 µm was positioned in the dummy pattern area around the measurement mark structure. Each of the measurement mark structure and the dummy uneven structure had the rotational symmetry having the center of the measurement area as the four-fold axis at the constant angle of 90° (see FIG. 19). In addition, the outer dimension L1 of the measurement area shown in FIG. 19 (the length of the outer circumferential side of the dummy pattern area) was 100 µm, the length L2 of the inner circumferential side was 60 µm, and the distance L3 between the inner circumferential side of the dummy pattern area and the measurement mark structure was 24 µm. Note that the uneven structure of the master mold was observed by the scanning electron microscope, and the dimensions thereof were measured.

<Pattern Formation>

As the transfer substrate for the replica mold, a mesa-structure quartz glass substrate (152 mm×152 mm, thickness 6.35 mm) that had a projection structure portion having the size of 25 mm×30 mm and the height of 30 µm at the center was prepared. Droplets of a photo-curable molded resin were supplied to the projection structure portion of the transfer substrate by using an ink jet apparatus.

The transfer substrate to which the molded resin was supplied in the above manner and the master mold were brought close to each other, the droplets were spread between the master mold and the transfer substrate, and a photo-curable resin layer was formed.

Then, parallel light (ultraviolet having a peak wavelength of 365 nm) was emitted from an illumination optical system of the imprint apparatus to the side of the master mold under a condition of 1000 mJ/cm$^2$. With this, light irradiation was performed from the side of the master mold, the photo-curable resin layer was thereby cured, and a transfer resin layer to which the uneven structure of the master mold was transferred was formed.

Next, the transfer resin layer and the master mold were separated from each other, and the pattern structure, which is the transfer resin layer, was positioned on the transfer substrate for the replica mold.

<Evaluation of Pattern Structure>

With regard to the measurement mark structure of the master mold and the measurement mark formed together with the pattern structure positioned on the transfer substrate for the replica mold, the positions of the end portions in the X direction and the Y direction shown in FIG. 31 were detected in each measurement area. Further, with regard to the measurement mark positioned on the transfer substrate for the replica mold, the width of the measurement mark in each measurement area was measured. Subsequently, a difference in displacement amount between the position of the measurement mark on the transfer substrate for the replica mold and the position of the measurement mark structure of the master mold was determined for each of the X direction and the Y direction, and the standard deviation a thereof was calculated. In addition, the standard deviation σ of the width of the measurement mark in each of the X direction and the Y direction was calculated. As a result, as shown in Table 2 shown below, 3σ of the displacement amount of the measurement mark position in the X direction was 3.06 nm, and 3σ of the displacement amount of the measurement mark position in the Y direction was 4.17 nm. In addition, 3σ of the width of the measurement mark in the X direction was 8.7 nm, and 3σ of the width of the measurement mark in the Y direction was 8.7 nm. From these results, it was determined that the deformation of the measurement mark was sufficiently prevented. Note that the detection of the position of the end portion of the measurement mark was performed by using IPRO Series manufactured by KLA-tencor Corporation.

Example 4

In the fabrication of the master mold, four drawing areas each having a rectangular plan view shape (1 µm×8 µm) were set so as to be positioned at individual sides of a 12-µm square in a square (40 µm×40 µm) area at the center in each measurement area, and the area of a flat surface on which no pattern is present was reduced as compared with Example 3. In addition, an area other than the square area at the center was used as a dummy pattern area, and a drawing area in the line/space shape (line: 0.2 μm, space: 0.2 μm) that was disposed such that the longitudinal direction of the pattern matched the Y direction (see FIG. 31) was set. That is, the plan view shape of the dummy pattern area had the rotational symmetry having the four-fold axis at the constant angle of 90°, the plan view shape of the dummy uneven structure had the rotational symmetry having the two-fold axis at the constant angle of 180°, and the four-fold axis coincided with the two-fold axis. The master mold was fabricated in the same manner as in Example 3 except the above change.

In addition, by using this mater mold, the pattern structure was formed on the transfer substrate for the replica mold in the same manner as in Example 3.

With regard to the measurement mark formed together with the pattern structure, similarly to Example 3, a difference in displacement amount between the position of the measurement mark on the transfer substrate for the replica mold and the position of the measurement mark structure of the master mold was determined for each of the X direction and the Y direction, and the standard deviation a thereof was calculated. In addition, the standard deviation a of the width of the measurement mark in each of the X direction and the Y direction was calculated. As a result, as shown in Table 2 shown below, 3σ of the displacement amount of the measurement mark position in the X direction was 2.07 nm, and 3σ of the displacement amount of the measurement mark position in the Y direction was 3.49 nm. In addition, 3σ of the width of the measurement mark in the X direction was 3.4 nm, and 3σ of the width of the measurement mark in the Y direction was 5.4 nm. From these results, in Example 4, it was determined that the square area at the center in each measurement area was reduced and the dummy pattern area was thereby increased, and the distance between the measurement mark structure and the dummy uneven structure was reduced and the deformation of the measurement mark was further thereby prevented as compared with Example 3.

On the other hand, since the dummy uneven structure had the line/space shape in which the longitudinal direction of the pattern matched the Y direction, it was determined that, for the displacement and deformation, large anisotropy was present in the X direction and the Y direction as compared with Example 3, and Example 4 was slightly inferior to Example 3 in this respect.

Comparative Example 2

Figure 32:
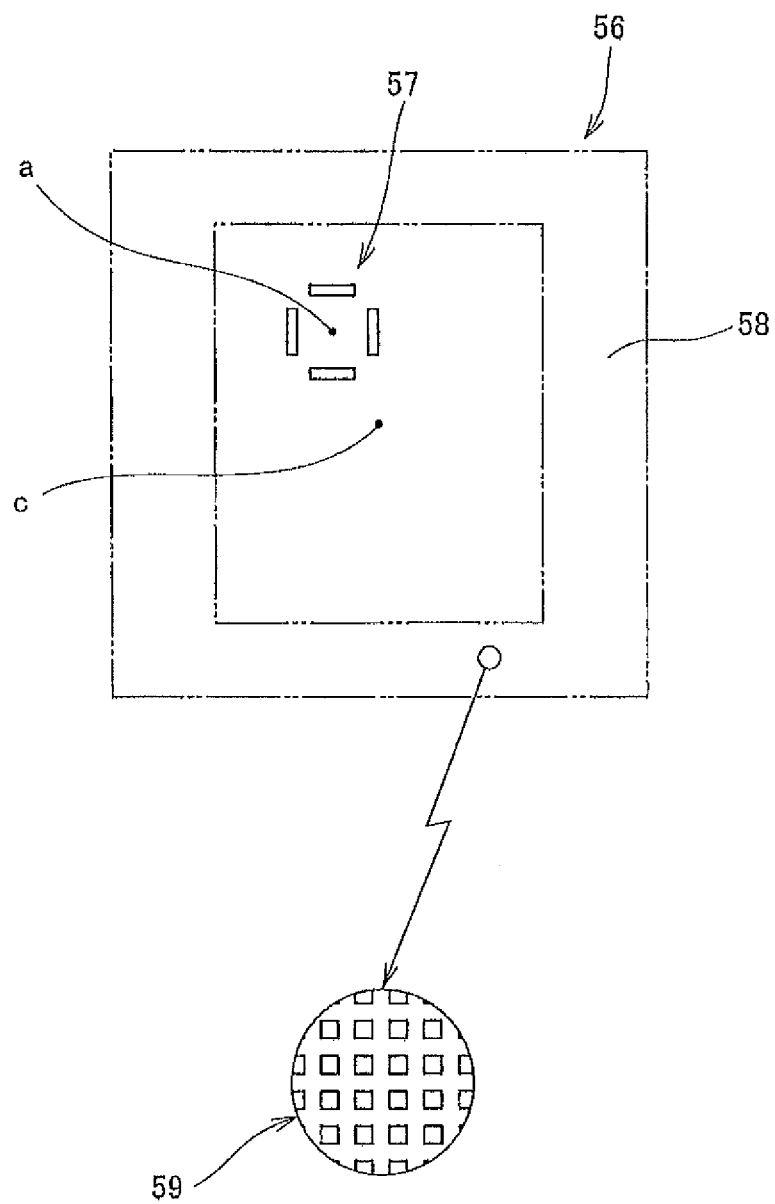
FIG. 32 is a plan view showing the positional relationship between a dummy pattern area and the measurement mark structure in Comparative Example 2.

In the fabrication of the mold, a square measurement area (158 μm×153 μm) was set in each intersection portion of the non-main pattern area, a rectangular (100 μm×115 μm) area was set at the center in each measurement area, and an area other than the rectangular area at the center was used as the dummy pattern area. In addition, the center of the rectangular area did not coincide with the center of the measurement mark structure, and the maximum value of the distance L3 between the inner circumferential side of the dummy pattern area and the measurement mark structure shown in FIG. 19 was set to 78 μm, and the minimum value thereof was set to 25 μm. That is, as shown in FIG. 32, the plan view shape of the dummy pattern area 58 didn't have the rotational symmetry having the four-fold axis at the constant angle of 90°, the plan view shape of the measurement mark structure 57 had the rotational symmetry having the four-fold axis a of the constant angle of 90°, but the four-fold axis a didn't coincide with the center c of the measurement area. The mold was fabricated in the same manner as in Example 3 except the above change.

In addition, by using this mold, the pattern structure was formed on the transfer substrate in the same manner as in Example 3.

With regard to the measurement mark formed together with the pattern structure, similarly to Example 3, a difference in displacement amount between the position of the measurement mark on the transfer substrate for the replica mold and the position of the measurement mark structure of the master mold was determined for each of the X direction and the Y direction, and the standard deviation a thereof was calculated. In addition, the standard deviation a of the width of the measurement mark in each of the X direction and the Y direction was calculated. As a result, as shown in Table 2 shown below, 3σ of the displacement amount of the measurement mark position in the X direction was 6.49 nm, and 3σ of the displacement amount of the measurement mark position in the Y direction was 6.64 nm. In addition, 3σ of the width of the measurement mark in the X direction was 11.8 nm, and 3σ of the width of the measurement mark in the Y direction was 9.8 nm. From these results, it was determined that the deformation of the measurement mark was large as compared with Example 3 and Example 4 and, as the result of the large deformation, the displacement was also large as compared with Example 3 and Example 4.

TABLE 2

| MEASUREMENT ITEM | | EXAMPLE 3 | EXAMPLE 4 | COMPARATIVE EXAMPLE 2 |
|---|---|---|---|---|
| 3σ OF DISPLACEMENT AMOUNT OF MEASUREMENT MARK POSITION (nm) | X DIRECTION | 3.06 | 2.07 | 6.49 |
| | Y DIRECTION | 4.17 | 3.49 | 6.64 |
| 3σ OF WIDTH OF MEASUREMENT MARK (nm) | X DIRECTION | 8.7 | 3.4 | 11.8 |
| | Y DIRECTION | 8.7 | 5.4 | 9.8 |

From the results of Example 3, Example 4, and Comparative Example 2, it was determined that, as the distance between the inner circumferential side of the dummy pattern area and the measurement mark structure (L3 shown in FIG. 19) was reduced, 3σ of the displacement amount of the measurement mark position was reduced.

INDUSTRIAL APPLICABILITY

The present invention can be applied to the manufacturing of various pattern structures and fine processing of a workpiece such as a substrate that use the imprint method.

REFERENCE SIGNS LIST

1 Imprint mold
2 Base
4 Main pattern area
5 Non-main pattern area
6 Measurement area
7 Measurement mark structure
7a, 7b, 7c, 7d, 7e Pattern set
17 Measurement mark structure
18 Flat portion
19 Sub-structure
19a, 19b Pattern set
21 Transfer substrate
31 Droplet
32 Molded resin layer
35 Transfer resin layer
47 Measurement mark
51 Imprint mold
52 Base
54 Main pattern area
55 Non-main pattern area
56 Measurement area
57 Measurement mark structure
58 Dummy pattern area
59, 59a, 59b Dummy uneven structure
71 Transfer substrate
81 Droplet
82 Molded resin layer
85 Transfer resin layer
97 Measurement mark
A Uneven structure area

The invention claimed is:

1. An imprint mold comprising:
a base;
an uneven structure area set on a surface of the base;
a measurement area set in the uneven structure area; and
a measurement mark structure positioned in the measurement area, wherein
the measurement mark structure is constituted by a flat portion and a sub-structure positioned around the flat portion,
a plan view shape of the flat portion has a rectangular shape,
the sub-structure is a pattern set in which a plurality of fine patterns are arranged at a predetermined pitch, and
the fine patterns are dot-shaped depressions or projections.

2. The imprint mold according to claim 1, wherein
at least one of a width of each of the fine patterns constituting the sub-structure and an interval between the fine patterns is less than a resolution of a position detection apparatus used when a measurement mark formed by the measurement mark structure is detected.

3. The imprint mold according to claim 2, wherein
the sub-structure has two or more types of the pattern sets, and
the pattern set positioned adjacent to the flat portion has a line/space shape.

4. The imprint mold according to claim 1, wherein
a dimension of the flat portion is not less than a resolution of a position detection apparatus used when a measurement mark formed by the measurement mark structure is detected.

5. The imprint mold according to claim 1, wherein
a plan view shape of the measurement mark structure has rotational symmetry having a four-fold axis at a constant angle of 90°.

6. The imprint mold according to claim 5, wherein
a plan view shape of the measurement area is a square shape, and
a center of the square shape coincides with the four-fold axis of the rotational symmetry of the measurement mark structure.

7. The imprint mold according to claim 1, wherein
the measurement mark structure has a plurality of the flat portion and a plurality of the sub-structure that are located around each of the plurality of flat portions.

8. An imprint mold comprising:
a base;
an uneven structure area set on a surface of the base; and
a measurement area set in the uneven structure area, wherein
a measurement mark structure, a dummy pattern area set so as to surround the measurement mark structure with a desired distance set therebetween, and a dummy uneven structure positioned in the dummy pattern area are provided in the measurement area.

9. The imprint mold according to claim 8, wherein
a plan view shape of the dummy pattern area has rotational symmetry having a four-fold axis at a constant angle of 90°.

10. The imprint mold according to claim 8, wherein
the dummy uneven structure has a plurality of dot-shaped depressions or projections or a plurality of depressions or projections in a line/space shape.

11. The imprint mold according to claim 10, wherein
the dot-shaped depressions or projections or the depressions or the projections in the line/space shape are arranged so as to form density gradation.

12. The imprint mold according to claim 8, wherein
the dummy uneven structure has a plurality of dot-shaped depressions or projections and a plurality of depressions or projections in a line/space shape.

13. The imprint mold according to claim 8, wherein
a plan view shape of the dummy uneven structure has rotational symmetry having a two-fold axis at a constant angle of 180°.

14. The imprint mold according to claim 13, wherein
a plan view shape of the measurement mark structure has rotational symmetry having a four-fold axis at a constant angle of 90°, and
the four-fold axis coincides with the two-fold axis of the rotational symmetry of the dummy uneven structure.

15. The imprint mold according to claim 8, wherein
a plan view shape of the dummy uneven structure has rotational symmetry having a four-fold axis at a constant angle of 90°.

16. The imprint mold according to claim 15, wherein
a plan view shape of the measurement mark structure has rotational symmetry having a four-fold axis at a constant angle of 90°, and
the four-fold axis coincides with the four-fold axis of the rotational symmetry of the dummy uneven structure.

17. The imprint mold according to claim 8, wherein a plan view shape of an inner periphery and an outer periphery of the dummy pattern area is a shape having four-fold symmetry, and
a four-fold axis of a plan view shape of the inner periphery coincides with a four-fold axis of a plan view shape of the outer periphery.

18. The imprint mold according to claim 17, wherein
a plan view shape of the measurement mark structure is a shape having four-fold symmetry, and
the four-fold axis of the plan view shape of the inner periphery, the four-fold axis of the plan view shape of the outer periphery, and a four-fold axis of the plan view shape of the measurement mark structure coincide with each other.

19. The imprint mold according to claim 8, wherein the measurement mark structure is a structure that is used for forming a measurement mark that is used for detecting a magnitude and direction of a deviation with respect to design coordinates of the pattern of the pattern structure that is formed for corresponding to uneven structures on the uneven structure area.

* * * * *